(12) United States Patent
Younsi et al.

(10) Patent No.: US 7,676,333 B2
(45) Date of Patent: Mar. 9, 2010

(54) METHOD AND APPARATUS FOR ANALYZING PARTIAL DISCHARGES IN ELECTRICAL DEVICES

(75) Inventors: Abdelkrim Younsi, Ballston Lake, NY (US); Sameh Ramadan Salem, Rexford, NY (US); Weizhong Yan, Clifton Park, NY (US); Gian Carlo Montanari, Bologna (IT)

(73) Assignee: General Electric Company, Schenectady, NY (US)

( * ) Notice: Subject to any disclaimer, the term of this patent is extended or adjusted under 35 U.S.C. 154(b) by 77 days.

(21) Appl. No.: 11/935,956

(22) Filed: Nov. 6, 2007

(65) Prior Publication Data
US 2009/0119035 A1 May 7, 2009

(51) Int. Cl.
*G01R 31/02* (2006.01)
(52) U.S. Cl. .......................................... 702/58; 324/458
(58) Field of Classification Search .................... 702/57, 702/58, 59, 81–84, 179–185, 196; 324/457, 324/520, 536, 551, 458
See application file for complete search history.

(56) References Cited

U.S. PATENT DOCUMENTS

| | | | |
|---|---|---|---|
| 5,256,976 A | 10/1993 | Ishikawa et al. | |
| 5,475,312 A | 12/1995 | Sedding et al. | |
| 5,506,511 A | 4/1996 | Nilsson et al. | |
| 5,680,059 A | 10/1997 | Shiota et al. | |
| 5,828,227 A | 10/1998 | Shiota et al. | |
| 5,982,181 A | 11/1999 | Rokunohe et al. | |
| 6,088,658 A | 7/2000 | Yazici et al. | |
| 6,114,871 A | 9/2000 | Shiota et al. | |
| 6,192,317 B1 | 2/2001 | Yazici et al. | |
| 6,300,768 B1 | 10/2001 | Kato et al. | |
| 6,313,640 B1 | 11/2001 | Nasrallah et al. | |
| 6,424,162 B1 | 7/2002 | Rokunohe et al. | |
| 6,445,189 B1 | 9/2002 | Pakonen et al. | |
| 6,448,782 B1 | 9/2002 | Pakonen et al. | |
| 6,469,515 B2 | 10/2002 | Borsi et al. | |
| 6,483,316 B2 | 11/2002 | Kato et al. | |
| 6,507,181 B1 | 1/2003 | Pakonen et al. | |
| 6,809,523 B1 | 10/2004 | Ahmed et al. | |
| 2002/0163344 A1 | 11/2002 | Rokunohe et al. | |
| 2007/0063709 A1 | 3/2007 | Goodrich et al. | |
| 2008/0088314 A1* | 4/2008 | Younsi et al. ............... | 324/457 |

FOREIGN PATENT DOCUMENTS

WO WO 2007/093861 A2 8/2007

* cited by examiner

*Primary Examiner*—John H Le
(74) *Attorney, Agent, or Firm*—Armstrong Teasdale LLP

(57) ABSTRACT

A method of analyzing partial discharge data collected from an electrical device includes collecting partial discharge data from a first electrical device belonging to a group of electrical devices. The group of electrical devices is at least partially defined by at least one electrical device classification. The method also includes generating a comparison of at least a portion of the partial discharge data collected from the first electrical device with at least a portion of the partial discharge data collected from at least one second electrical device. The at least one second electrical device is selected from the group of electrical devices that includes the first electrical device. The method further includes transmitting the results.

19 Claims, 17 Drawing Sheets

METHOD AND APPARATUS FOR ANALYZING PARTIAL DISCHARGES IN ELECTRICAL DEVICES

BACKGROUND OF THE INVENTION

This invention relates generally to electrical device condition assessment analyzers and more particularly, to methods and analysis systems for assessing partial discharge (PD) in electrical machinery.

Partial discharge events in an insulation system are pulsed releases of energy that propagate out from their site of origin. The propagation occurs according to the structure surrounding the partial discharge events. An internally generated partial discharge pulse appears and propagates at the end regions of an electrical device, such as a high or low voltage bushing and generator end windings, as specific pulse waves in accordance with the surrounding structure, the location of the origin of the pulse, and the pulse characteristics. Although partial discharge analysis has been used for many years on various electrical equipment, at least some data collections and data interpretations are performed substantially manually using labor-intensive techniques. Specifically, most known methods of partial discharge data interpretation typically include using extensive analysis to interpret the data collected in conjunction with, and in reference to, data collected as a function of differing operating and environmental conditions associated with the electrical machine and/or the insulation system. Such extensive analysis typically requires obtaining subject matter experts in the form of highly specialized industry professionals which can be time-consuming and expensive. Moreover, such analyses are neither automated nor substantially close to a present time.

BRIEF DESCRIPTION OF THE INVENTION

In one aspect, a method of analyzing partial discharge data collected from an electrical device is provided. The method includes collecting partial discharge data from a first electrical device belonging to a group of electrical devices. The group of electrical devices is at least partially defined by at least one electrical device classification. The method also includes generating a comparison of at least a portion of the partial discharge data collected from the first electrical device with at least a portion of the partial discharge data collected from at least one second electrical device. The at least one second electrical device is selected from the group of electrical devices that includes the first electrical device. The method further includes transmitting the results.

In another aspect, a partial discharge analyzer system is provided. The partial discharge analyzer system includes at least one output device. The partial discharge analyzer system also includes a processor coupled in electronic data communication with the at least one output device. The processor is programmed with a plurality of percentile transfer function algorithms configured to generate a comparison of at least a portion of partial discharge data collected from a first electrical device with at least a portion of partial discharge data collected from at least one second electrical device. The processor is further programmed to generate and transmit the comparison to the at least one output device. The comparison is at least partially generated as a function of at least one of at least one electrical device classification and at least one electrical device operational parameter.

In a further aspect, an electrical device monitoring system is provided. The electrical device monitoring system includes a data acquisition system adapted to transmit a first signal substantially representative of a measurement received from at least one process parameter sensor. The electrical device monitoring system also includes a partial discharge analyzer system configured to receive the first signal and a second signal substantially representative of high frequency electromagnetic pulses. The partial discharge analyzer system includes a processor programmed with a plurality of percentile transfer function algorithms configured to generate a comparison of at least a portion of partial discharge data collected from a first electrical device with at least a portion of partial discharge data collected from at least one second electrical device. The processor is further programmed to generate and transmit the comparison. The comparison is at least partially generated as a function of at least one of at least one electrical device classification and at least one electrical device operational parameter.

DETAILED DESCRIPTION OF THE INVENTION

Figure 1:
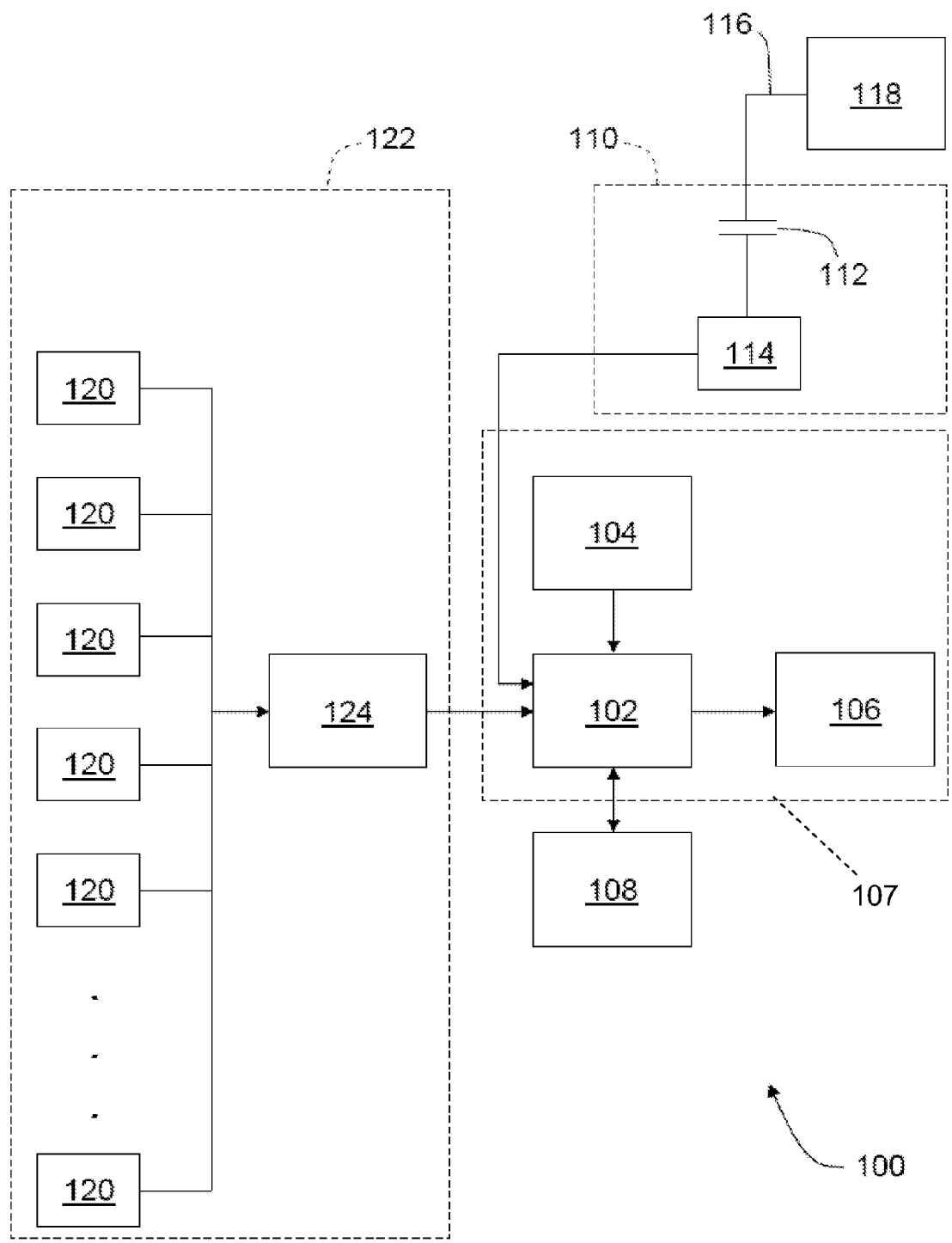
FIG. 1 is a schematic block diagram of an exemplary on-line real-time partial discharge analyzer system.

FIG. 1 is a schematic block diagram of an exemplary on-line, real-time partial discharge (PD) analyzer system 100. In the exemplary embodiment, PD pulses are recorded using analyzer system 100, which is configured to receive PD pulses with frequencies within a bandwidth that includes an upper limit of approximately 100 MHz. Alternatively, system 100 is configured to receive PD pulses within any frequency range. Analyzer system 100 includes a data analysis and diagnostics module 102, a model/rules module 104, and an output module 106, wherein both modules 104 and 106 are coupled in electronic data communication with module 102. In the exemplary embodiment, modules 102, 104 and 106 are configured within a first processor 107. Alternatively, modules 102, 104 and 106 are configured within a plurality of processors (not shown). System 100 also includes a data history logger module 108 coupled in electronic data communication with module 102. In the exemplary embodiment, logger module 108 is a peripheral data logger directly associated with a process plant distributed control system (DCS) and does not form a portion of analyzer system 100. Alternatively, data history logger module 108 is a dedicated module associated with analyzer system 100.

Data analysis and diagnostics module 102 is also coupled in electronic data communication with a partial discharge sensor 110 that includes a coupler 112 and a signal conditioning module 114. Module 114 is coupled in electronic data communication with module 102. Moreover, coupler 112 is generally electrically coupled to an electric power supply lead or bus 116 that is in turn electrically coupled to a device of interest, such as an electrical machine 118. Alternatively, other devices of interest include, but are not limited to, transformer bushings and electric power transmission cables and bus ducts. Examples of couplers that may be used include, but are not limited to, cable-type, epoxy mica couplers (EMC), antennas, and radio frequency current transformers (RFCT). For multiphase machines 118, analyzer system 100 uses one sensor per phase. In the exemplary embodiment, coupler 112 has a capacitive value of 1000 picoFarad (pF). Alternatively, coupler 112 has any capacitive value that facilitates operation of system 100 as described herein.

Data analysis and diagnostics module 102 is also coupled in electronic data communication with a plurality of process parameter sensors 120 through a plant data acquisition system 122 that includes a second processor 124. Process parameter sensors 120 are coupled to various process parameters and parameters associated with the environment surrounding machine 118. Such process parameters include but are not limited to, bus voltage, bus current, machine real power, machine reactive power, temperature of windings, oil and/or hydrogen depending on the type of machine, machine vibration, a stator leak monitoring system (SLMS), flux probes, ozone, hydrocarbon concentration, protecting relaying device alarms, neutral current and voltage, field ground detector, hydrogen pressure, and combinations thereof. The environmental parameters include but are not limited to, ambient temperature, ambient humidity, atmospheric pressure, and combinations thereof.

Furthermore, parameters derived or calculated from other parameters may also be transmitted to data analysis and diagnostics module 102. For example, ozone detected in a machine indicates the presence of external corona activity. An increase of PD with ozone levels indicates external PD. A finer interpretation of PD plots based on phase and pulse shape can help confirm surface or bulk PD. Another example is that humidity can cause a seasonal variation in PD levels on air cooled generators. Knowing the relative humidity (RH) level facilitates interpreting trends over time and avoids false diagnostics. Yet another example is that winding temperature changes with load affect both bulk and surface PD. Knowing temperature/PD values and trends helps in identifying whether PD sources are located in the bulk of the insulation or at the surface of the winding bars.

During operation, coupler 112 is configured to receive high frequency pulses transmitted through bus 116. The high frequency pulses include noise pulses and PD pulses generated in machine 118 and other equipment coupled to bus 116, for example, support insulators, a transformer or a motor (neither shown). When electrical machine 118 is in operation, high-frequency noise is generated by electrical machine 118 itself and surrounding devices, and pulses of the high-frequency noise are detected by PD sensor 110.

Partial discharges (PDs) are pulse events with a sudden localized redistribution of charge in or on high voltage insulating materials at relatively high electric stress. The PD events are frequently an indicator of failure processes that are active within or on the insulation. A PD and the reversal of charge that occurs in connection with it show as a current pulse in the connectors of the insulating material. In practice, these current pulses also sum into the phase voltage of the system. Characteristics of PDs can be divided into two groups as follows: characteristics of a single PD pulse, such as shape and charge, and characteristics of a PD pulse group, such as pulse repetition frequency and pulse occurrence areas. Different PD types have different PD characteristics. Using these characteristics, it is possible to identify different PD types and the causes of the PD.

The PD event itself is typically of a very short duration. That is, the redistribution of charge, and hence pulse currents, associated with PD events typically occur in the sub-microsecond time scale. Specifically, time duration values of 10 nanoseconds and less can occur.

Data analysis and diagnostics module 102 receives the high frequency electromagnetic pulses, generated by the PD events, from partial discharge sensor 110 and receives a reference voltage signal indicative of the power signal on bus 116. Data analysis and diagnostics module 102 analyzes the phase angle of the PD signals versus the reference voltage and the shape of the pulses from the PD events and noise. Data analysis and diagnostics module 102 separates the noise from the PD events and analyzes the pulses associated with the PD events to determine the pulse origination location and character by applying rules and model features stored in model/rules module 104. Character of the PD events include an apparent severity of the PD events that may for example, be related to the charge dissipated during the event or to the local current flowing as a result of the PD event. As discussed further below, the rules may include threshold ranges for characteristics associated with known pulses from various locations within similar machines in a fleet of machines, and may also include machine operating and environmental parameters that may affect the partial discharge pulse shape characteristics. The characteristics of known pulses from the fleet of similar machines are stored in, for example, data history logger module 108.

Analyzer system 100 acquires data and simultaneously time-stamps and stores the data in a memory such as data history logger module 108. When analyzer system 100 processes the data the time stamp is used to correlate data received at various times in the past and also to correlate data collected on a different analyzer system. Data files are transferred between different analyzer systems to facilitate establishing a large inventory of pulse characteristics that can then be used for comparison and validation. Rules are generated from the characteristics of known pulses and applied to the received pulses to determine the location and character of the partial discharge associated with the received pulses. Similarly, modeled pulses may be determined and stored in data history logger module 108 for particular configurations of components in a machine that does not have a history of known pulses associated with partial discharge events. For example, a new model generator or transformer may not have sufficient operating history to develop a database of known partial discharge pulses. Rather, the configuration is modeled and characteristics of modeled pulses are used to determine partial discharge locations and character.

Results of the analysis are transmitted to output module 106, where it may be further processed and displayed to a user. Output module 106 displays results indicative of machine aging behavior including trends of machine 118 and comparisons to other machines (as discussed further below). Output module 106 also displays results indicative of service demand of machine 118 including recommended service to prolong the service life of machine 118, risk assessment of continued operation with and without service, and action recommendations when analyzer system 100 determines that a failure is imminent or likely to occur before the next service interval. Such analysis results are determined automatically and are generated substantially close to a present time, or in real-time, as discussed further below.

Figure 2:
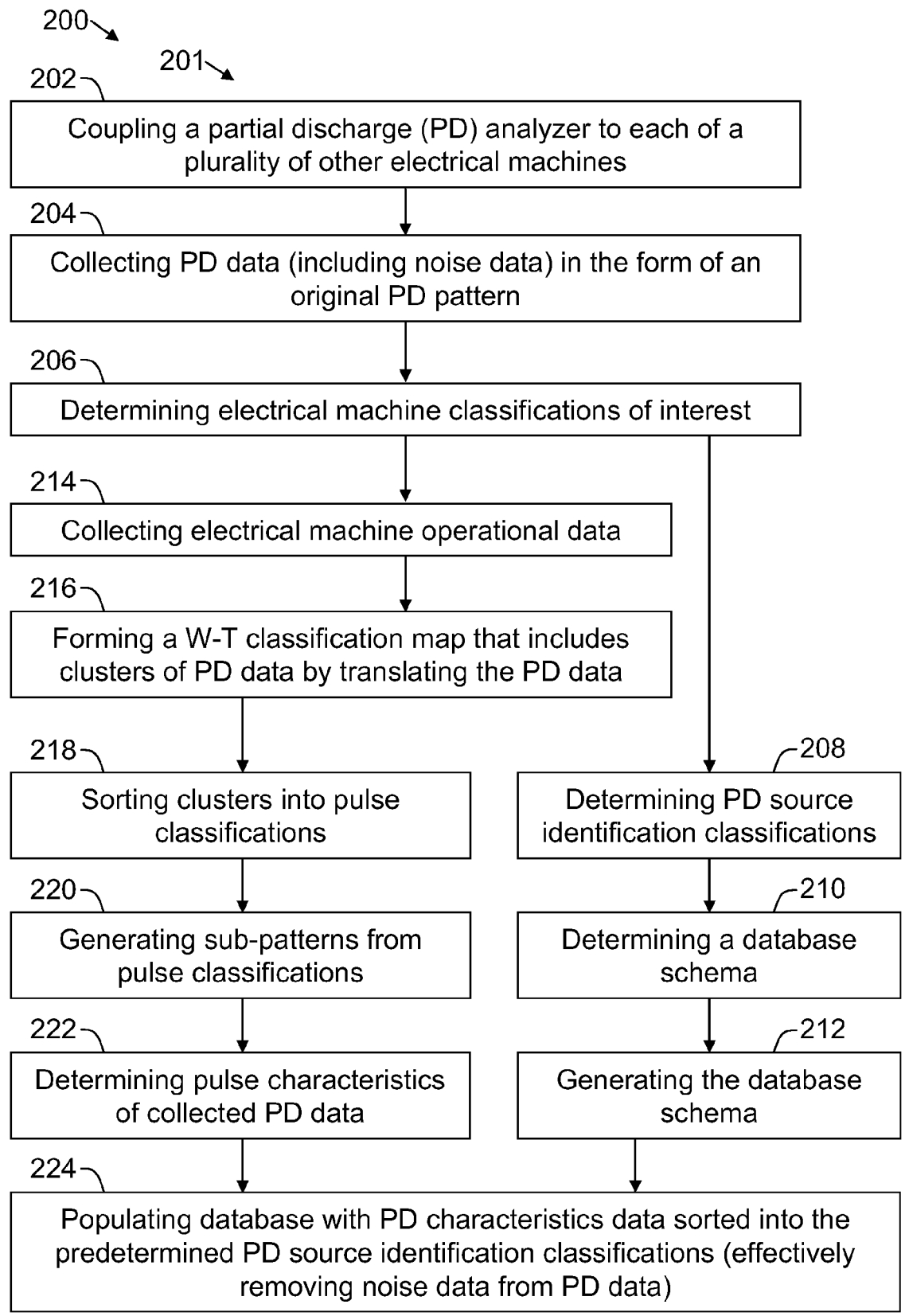
FIG. 2 is a flow chart illustrating a portion of an exemplary method of operating the partial discharge analyzer system shown in FIG. 1.

FIG. 2 is a flow chart illustrating a portion 201 of a method 200 of operating on-line real-time partial discharge (PD) analyzer system 100 (shown in FIG. 1). Method portion 201 includes a plurality of method steps for creating an electrical machine PD database (not shown). As such, method portion 201 includes a method step 202 coupling at least one partial discharge analyzer system 100 to each of a plurality of electrical machines (not shown), wherein each of the plurality of electrical machines, hereon referred to as the other electrical machines, is an electrical machine exclusive of machine of interest 118. Moreover, in the exemplary embodiment, such other machines include a fleet of machines, wherein each of such machines having at least some similar design, construction and operational classifications to other such machines, hereon referred to as machine classifications, are sorted into machine groups. For example, each of such other machines is sorted into one of a plurality of groups that include, but are not limited to, water-cooled electric power generators, hydrogen-cooled electric power generators, and air-cooled electric power generators, and/or combinations thereof. Moreover, such groups may include, but not be limited to, air-cooled electric motors. In the exemplary embodiment, step 202 includes permanently coupling one of system 100 to each of the other machines. Alternatively, method 202 includes temporarily coupling one of system 100 to each of the other machines. Further, alternatively, any method of collecting PD data that facilitates analysis as described herein is used.

Method portion 201 also includes a method step 204 collecting PD data (including noise data) from each of the other electrical machines in the form of an original PD pattern with noise data as described further below.

Figure 3:
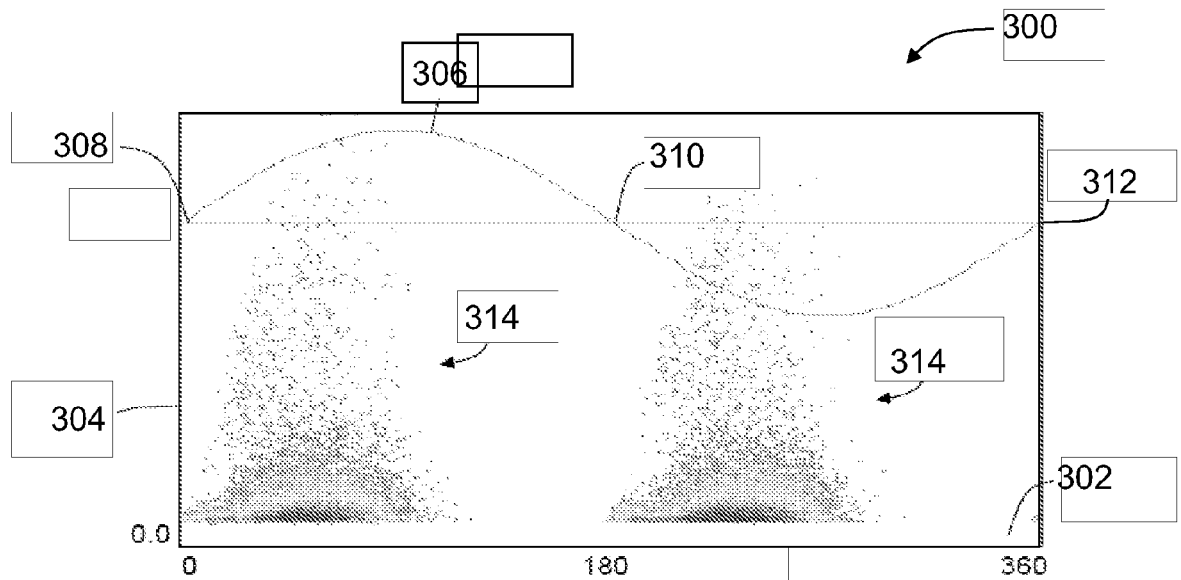
FIG. 3 is a graph of a partial discharge pulse amplitude vs. phase of occurrence for pulses that may be detected using the method shown in FIG. 2.

FIG. 3 is a graph 300 of partial discharge (PD) pulse amplitude vs. phase of occurrence for pulses that may be detected using method portion 201 (shown in FIG. 2). Specifically, graph 300 represents at least a portion of PD data taken on one of the other machines during a predetermined period of time using method step 204 as stored within logger module 108 (shown in FIG. 1). Such a phase-resolved PD pattern (PRPD pattern) illustrates information about PD pulse height and phase distribution, and forming the PRPD pattern is referred to as PRPD analysis (PRPDA). Graph 300 includes an x-axis 302 graduated in units of degrees (referenced to a standard 360 degree electrical cycle) and a y-axis 304 graduated in units of charge, specifically, nano-columbs (nC), indicating a magnitude of received high frequency pulses. A trace 306 indicates a relative magnitude of supply/generated voltage to the other electrical machine. At each zero crossing 308, 310, 312, when voltage increases in the positive or negative direction, stresses build in the insulation (not shown) associated with the other electrical machine and partial discharge pulses 314 are generated based on conditions that include, but are not limited to, the material condition of the insulation, machine operating conditions, and environmental conditions proximate to the other machine.

Typically, pulses 314 include PD pulses within the other machine, PD pulses from devices (not shown) electrically coupled to bus 116 that are external to the other machine, and noise pulses that originate from sources that include, but are not limited to, proximate electro-magnetic fields and commutation, radio frequency interference, and electrical power supply power quality deficiencies. Also, typically, determining PD pulses of interest from noise pulses and/or from partial discharges from sources external to the machine is difficult.

Referring again to FIG. 2, method portion 201 further includes a method step 206 determining electrical machine classifications of interest. As described above, each of the plurality of other machines is sorted into a particular group based on machine classifications that include, but are not limited to, similar design, construction and operational classifications. Method step 206 includes determining which of these machine classifications will define the predetermined electrical machine operational classifications of interest. In the exemplary embodiment, the primary machine classifications of interest are the electrical machines' voltage ratings. Alternatively, any machine classifications may be used as the classifications of interest including, but not limited to, real power rating (in Megawatts (MW)) and apparent power rating (in Kilovolt-amperes (KVA)).

Method portion 201 also includes a method step 208 determining PD source identification classifications. Step 208 includes defining PD source classifications that may subsequently be used to facilitate determining a likely source of the PD activity in question as discussed further below. However, in general, pulse characteristics that include, but are not limited to, magnitude, polarity, phase, and time of occurrence are used to facilitate determining PD source identification classifications. Potential sources of PD activity include, but are not limited to, corona discharges, surface discharges, internal discharges, invalid data, noise, and unknown causes.

Method portion 201 further includes a method step 210 determining a database schema. The predetermined database schema for an electrical machine PD database includes, but is not limited to, predetermined PD pulse characteristics and electrical machine classifications of interest as described above and further below.

Method portion 201 also includes a method step 212 generating the database schema wherein step 212 includes electronically forming the data storage and data relationship structure of the database within a database application. In the exemplary embodiment, the database application and the database are electronically resident within logger module 108. Alternatively, the database and database application are electronically resident in devices that include, but are not limited to, at least one dedicated database server, networked personal computers, and a distribution throughout a DCS.

Method portion 201 further includes a method step 214 collecting electrical machine operational data via sensors 120 and processor 124 (both shown in FIG. 1). Specifically, step 214 includes operational data collected substantially instantaneously with the PD data collected in step 204 as described above. Such operational data is transmitted to module 102 and includes, but is not limited to, machine voltage, machine MW, machine KVA, machine reactive power (in Megavolt-Amperes Reactive (MVAR)), machine temperatures and hydrogen pressure.

Method portion 201 also includes a method step 216 forming a W-T classification map. Step 216 includes forming clusters of PD data (including noise data) by translating the PD data (including noise data) collected in step 204. Step 216 includes one intermediate step (not shown), specifically, forming a phase-resolved, three-dimensional histogram as described further below.

Figure 4:
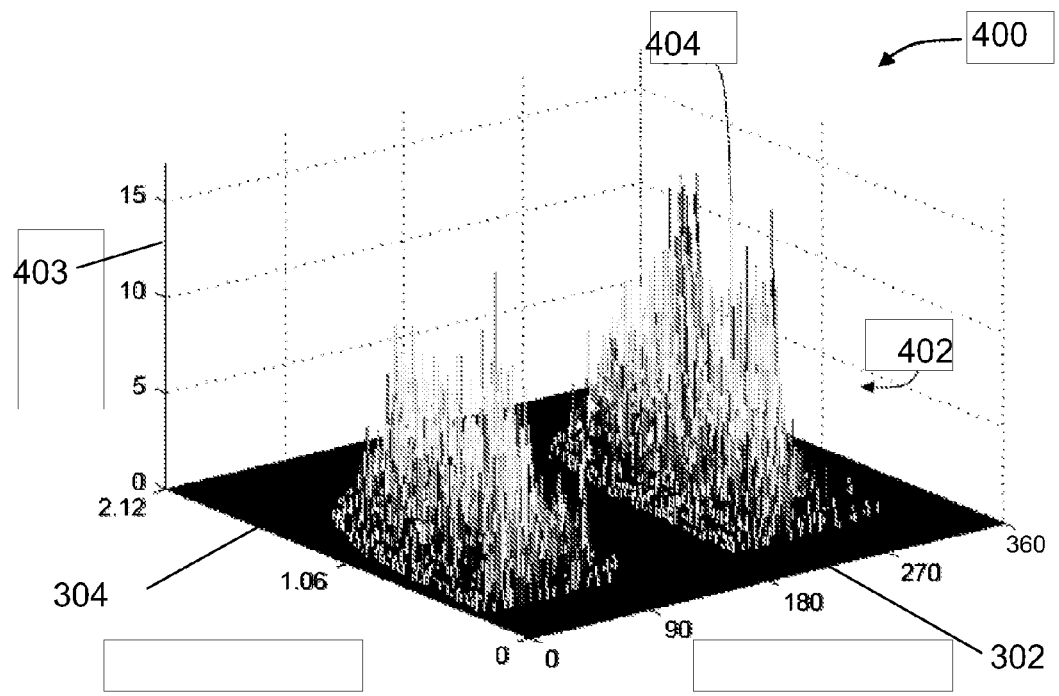
FIG. 4 is a graph of an exemplary phase-resolved histogram that may be generated from the phase-resolved partial discharge pattern shown in FIG. 3.

FIG. 4 is a graph 400 of an exemplary phase-resolved, three-dimensional histogram 402 that may be generated from phase-resolved, two-dimensional PD pattern 314 (shown in FIG. 3). Forming histogram 402 is included within step 216 (shown in FIG. 2). Step 216 is performed using modules 102 and 104 (both shown in FIG. 1). Graph 400 includes an abscissa (x-axis) 302 graduated in units of degrees (referenced to a standard 360 degree electrical cycle) and an ordinate (y-axis) 304 graduated in units of charge, specifically, nano-columbs (nC), indicating a magnitude of received high frequency pulses. Graph 400 also includes a z-axis 403 graduated in units of partial discharge counts. Therefore, histogram 402 illustrates the frequency of PD occurrence by sorting a plurality of pulses 404 with respect to pulse magnitude and phase in a 3-dimensional pattern. Histogram 403 is electronically stored within logger module 108. Similar to the phase-resolved PD pattern shown in FIG. 3, determining PD pulses of interest from noise pulses and/or from partial discharges from sources external to the machine is difficult.

Figure 5:
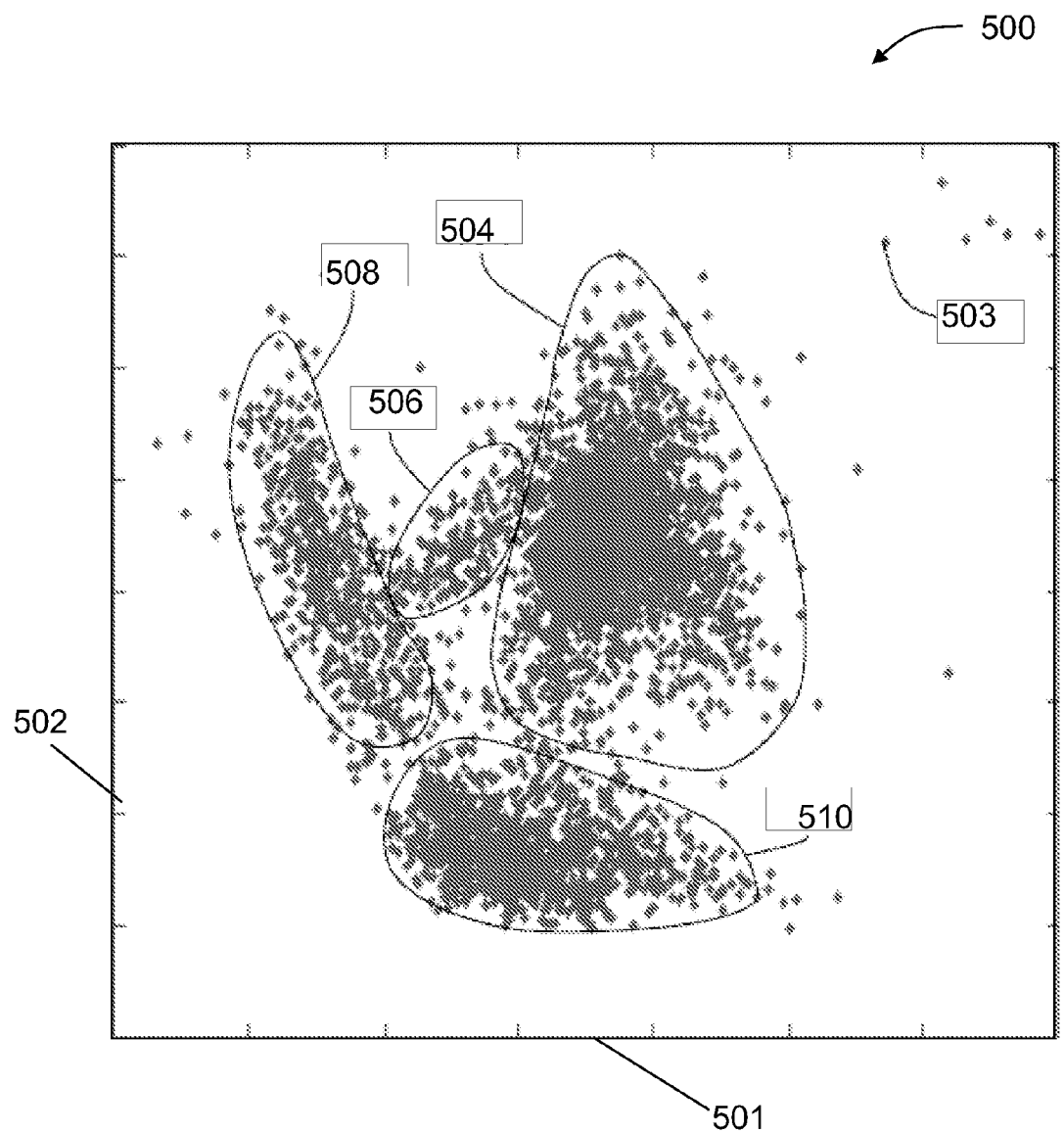
FIG. 5 is an exemplary classification map illustrating the results of the phase-resolved histogram shown in FIG. 4 transformed into the W-T domain.

FIG. 5 is an exemplary classification map 500 illustrating the results of phase-resolved histogram 402 transformed into the W-T domain via mathematical transformation methods (described further below) that include, but are not limited to, fast Fourier transform (FFT) methods. Method step 216 (shown in FIG. 2) includes forming classification map 500 using modules 102 and 104 (shown in FIG. 1). For each acquired signal represented in pattern 314 (shown in FIG. 4), the equivalent time-length (T) and bandwidth (W) are calculated and mapped in classification map 500. Classification map 500 includes an abscissa (x-axis) 501 graduated in units of time, specifically, nanoseconds (ns), and an ordinate (y-axis) 502 graduated in units of frequency, specifically, megahertz (MHz). Each pixel 503 on classification map 500 corresponds to one of the plurality of pulses 404 (shown in FIG. 4). Pixels 503 represent both partial discharge pulses and noise pulses received by partial discharge sensor 110 and transmitted to data analysis and diagnostics module 102 (both shown in FIG. 1). Typically, pixels 503 tend to group into clusters of pixels due to pixels representing a particular condition having similar time and frequency features, wherein clusters 504, 506, 508, and 510 tend to represent similar types of pulses. For example, in general, noise pulses tend to exhibit similar pulse characteristics as other noise pulses such that the associated noise pulse pixels tend to group in proximity to each other. Classification map 500 is electronically stored within logger module 108.

Referring again to FIG. 2, method portion 201 further includes a method step 218 sorting each of the plurality of clusters 504, 506, 508, and 510 into pulse classifications. As discussed above, noise pulses tend to exhibit similar characteristics as other noise pulses such that the associated noise pulse pixels tend to group in proximity to each other. Similarly, PD pulses having similar characteristics as other PD pulses tend to also group in proximity to each other, wherein PD pulses generated within the same defect tend to exhibit similar shapes. Therefore, clusters 504, 506, 508, and 510 are classified by the characteristics of each type of pulse in received plurality of pulses 404 (shown in FIG. 4). Such classification is performed within module 102 using rules resident within module 104, and such classification is stored within logger module 108 (all shown in FIG. 1).

Once clusters of pulses 504, 506, 508 and 510 are formed, each of pulses 404 within each cluster of pulses 504, 506, 508 and 510 undergoes further analysis performed directly as a function of the associated cluster features (and, indirectly as a function of the associated pulse characteristics) such that pulse classification is facilitated. Specifically, such further analysis includes separating and extracting data associated with each of clusters 504, 506, 508 and 510 via at least one algorithm that determines cluster boundaries and features by examining, for example, but not being limited to, a centroid of the cluster shape, a standard deviation, a skewness, and a kurtosis of the pixels. As used herein, kurtosis is a measure of the peakedness of the probability distribution of a real-valued random variable. Higher kurtosis means more of the variance is due to infrequent extreme deviations, as opposed to frequent modestly-sized deviations. Therefore, as a result of the analyses described above, classification of PD pulses 404 as a function of their clustering features is facilitated. Such further analysis is performed within module 102 using rules resident within module 104, and the results of such further analysis are stored within logger module 108.

Method portion 201 further includes a method step 220 generating sub-patterns (including noise data) from the pulse classifications determined in step 218. As discussed above, because PD pulses generated at the same defect tend to have similar pulse characteristics and exhibit similar pulse shapes, the pixels representing these signals are located near each other within the associated clusters in classification map 500 (shown in FIG. 5). Noise pulses also share similar characteristics and, therefore, are also similarly shaped to each other. Moreover, typically, since such noise pulses have dissimilar pulse characteristics, they are not shaped similarly to PD pulses. Subsequently, at least two classes can be identified by examining map 500, specifically, PD pulses and noise pulses. Therefore, the original pattern as represented by clusters 504, 506, 508 and 510 within classification map 500 is separated into a plurality of pulse classes. Moreover, each pulse 503 of each cluster 504, 506, 508 and 510 is translated to the time domain wherein a magnitude of each pulse (for example, in millivolts (mV)) may be examined individually as a function of time. Such time domain translation for each pulse 404 results in generation of a sub-pattern (not shown) for each pulse 404. Sub-patterns of similar pulses will also have similar shapes and characteristics. Method step 220 is performed using modules 102 and 104 and the results are electronically stored within logger module 108 (all shown in FIG. 1).

Processing sub-patterns of PD pulses that include substantially homogeneous features of PD-pulse shape, may provide a first level defect classification of PD pulses. For example, the pulses may be classified as internal, surface, or corona discharges. The pulses are then processed further using rules that determine the particular shape of each pulse and correlate the shapes to particular defect types, location, and/or character as discussed further below.

Method portion 201 also includes a method step 222 determining pulse characteristics of collected PD data (including noise data) from the other electrical machines. In the exemplary embodiment, as described above, each pulse 503 within plurality of received pulses 404, as grouped within clusters 504, 506, 508 and 510, is analyzed to permit classification of each of pulses 404 directly with respect to similar clustering features (and, indirectly as a function of similar pulse characteristics). Further, as discussed above, these clustering features include, but not limited to, a mean of amplitudes, a standard deviation of amplitudes, a skewedness of amplitudes, a kurtosis of amplitudes, a centroid of shape. Such clustering features are determined for pulses received during both the positive and negative portions of the supply voltage cycle. Once each of pulses 404 is translated into an associated sub-pattern, the associated sub-patterns are grouped such that the associated pulse characteristics of each sub-pattern are determined from such groupings. The associated pulse characteristics include, but are not limited to, phase angles and pulse magnitudes. Additionally, overall features of pulses 404 are determined such as, but not limited to, rise time, pulse width, spectral density, a maximum positive PD magnitude, a maximum negative PD magnitude, an overall mean of positive PD magnitudes, an overall mean of negative PD magnitudes, and a correlation between positive and negative PDs.

Further, characteristics of pulses 404 such as, but not limited to an alpha value, a beta value, a maximum peak of pulses, a minimum peak of pulses, a mean peak of pulses, and a standard deviation of pulse peaks are determined. Moreover, characteristics of pulses 404 as distributed within the W-T domain as illustrated in FIG. 5 are also determined. For example, but not being limited to, an overall mean, a mean in the T (or, time) dimension, mean in the W (or, frequency) dimension, a standard deviation in the T dimension, a standard deviation in the W dimension, a centroid of T distribution, and a centroid of W distribution may be determined. Method step 222 is performed using modules 102 and 104 and the results are electronically stored within logger module 108 (all shown in FIG. 1).

Method portion 201 also includes a method step 224 populating the database formed per method step 212 as described above with the PD characteristics data determined in method step 222 as described above. Such PD data is sorted into the PD source identification classifications determined per method step 208 as described above and stored within logger module 108 (shown in FIG. 1). Such sorting effectively separates the noise data from the PD data. The database of other electrical machines' PD data is electronically stored for future use as discussed below. Similarly, operation parameter data, including hydrogen pressure data, collected during collection of the PD data is also stored within the database for further use as described below.

Figure 6:
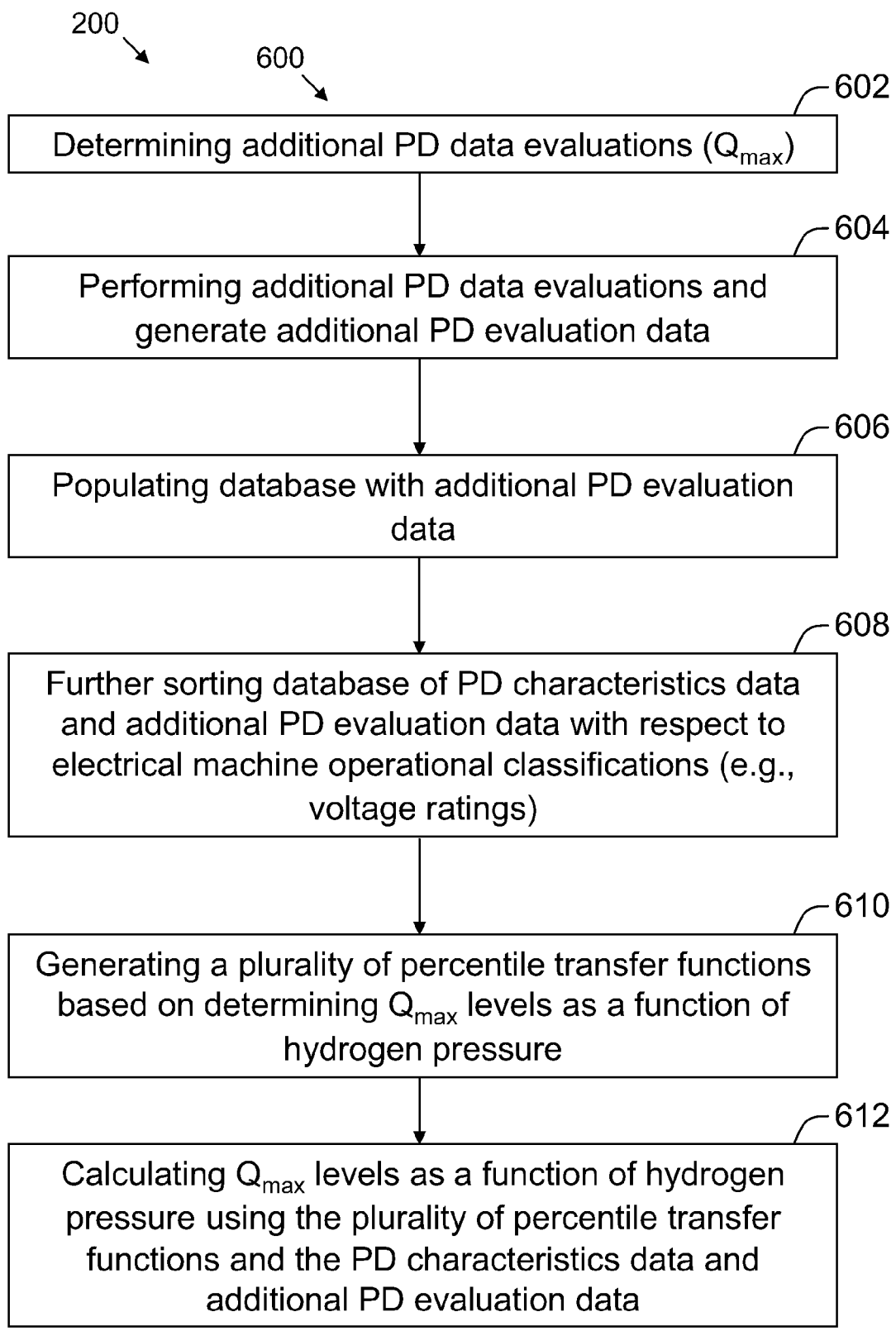
FIG. 6 is a flow chart illustrating a further portion of the method of operating the partial discharge analyzer system shown in FIG. 1.

FIG. 6 is a flow chart illustrating a further portion 600 of method 200 (a portion of which is shown in FIG. 2) of operating on-line real-time PD analyzer system 100 (shown in FIG. 1). Method portion 600 includes a plurality of method steps for generating a PD comparison scheme. As such, method portion 600 includes a method step 602 determining additional PD data evaluations. A variety of statistical analyses are available for evaluating the pulse data and a finite number of such analyses are selected for the exemplary pulse data. In the exemplary embodiment, such analyses selected include, but are not limited to, determinations of values for maximum partial discharge charge ($Q_{max}$), normalized quantity number (NQN), counts-per-cycle ($N_w$), a Weibull distribution, and a kurtosis of phase distribution. Such analyses further include statistical analysis of amplitude and phase distributions, for example, but not limited to, a mean phase angle of a pulse pattern, a phase spread of a pulse pattern, and a variance of pulse amplitude distribution. In the exemplary embodiment, $Q_{max}$ is the primary parameter used for further evaluation of pulse data. Alternatively, any parameter and any statistical analysis that facilitates operation of system 100 as described herein is used.

Method portion 600 also includes a method step 604 performing additional PD data evaluations and generating additional PD evaluation data. Each group of PD pulse data previously recorded within the steps described above and stored within logger module 108 is further evaluated by performing calculations within module 102 using rules resident within module 104. Specifically, in the exemplary embodiment, method step 604 determines $Q_{max}$ values as described further below in units of mV.

Figure 7:
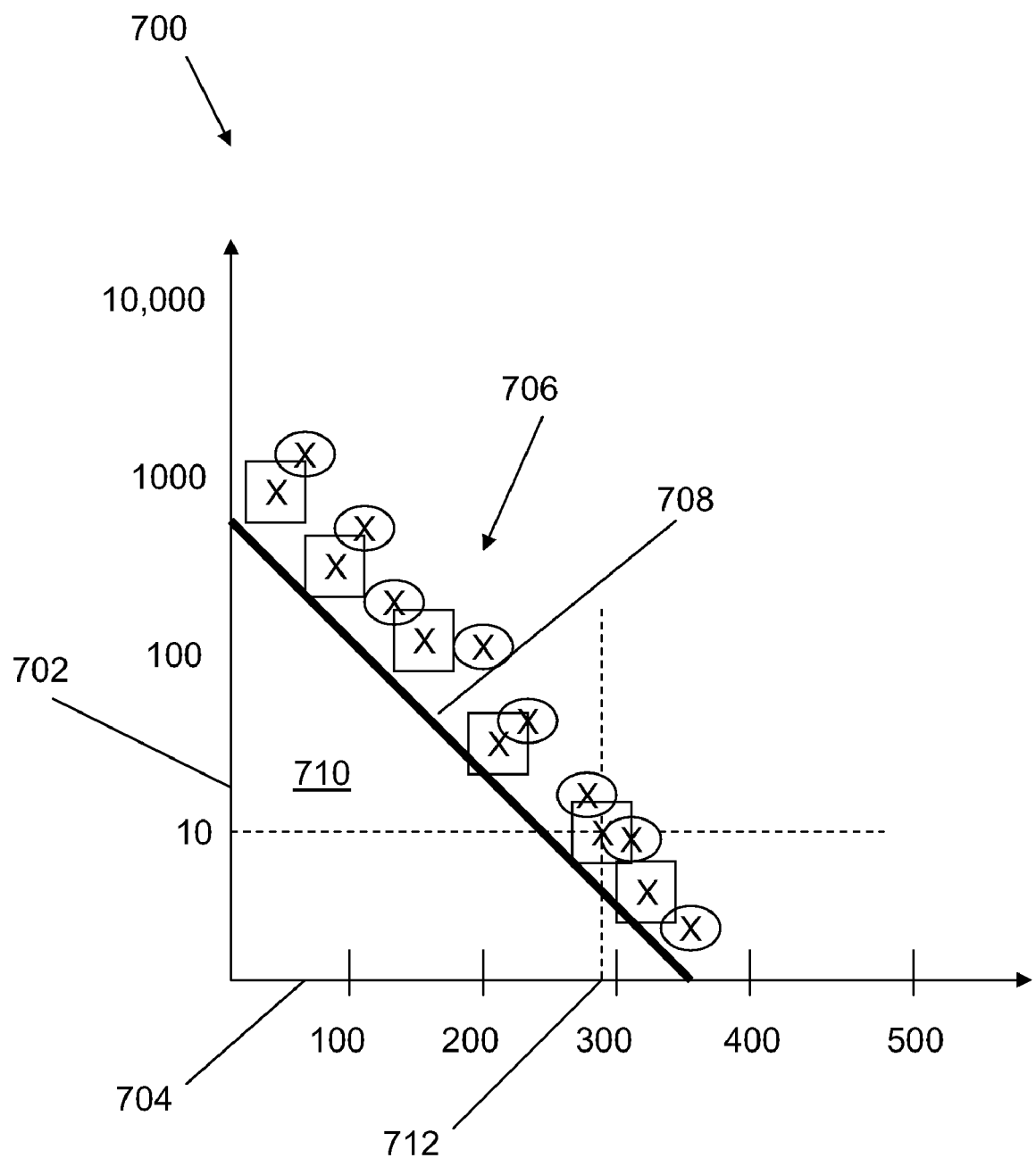
FIG. 7 is a graphical representation of NQN and $Q_{max}$ determinations made within the partial discharge analyzer system shown in FIG. 1.

FIG. 7 is a graphical representation, or graph 700, of NQN and $Q_{max}$ determinations made within on-line real-time partial discharge analyzer system 100 (shown in FIG. 1) per method step 604. Graph 700 includes an ordinate (y-axis) 702 graduated logarithmically in units of partial discharge pulses per second and an abscissa (x-axis) 704 graduated in units of pulse magnitude in millivolts (mV). A plurality of PD pulse data points 706 having a partial discharge rate and a corresponding pulse amplitude are plotted on graph 700 wherein a "best fit" line 708 is formed approximately through and/or adjacent to data 706. Line 708, x-axis 704 and y-axis 702 form a triangular area 710 that represents a normalized quantity number (NQN). A maximum partial discharge charge ($Q_{max}$) value 712 is defined as the pulse magnitude equivalent to 10 pulses per second (pps).

Method portion 600 further includes a method step 606 populating database with additional PD evaluation data. Specifically, the database electronically maintained within logger module 108 (shown in FIG. 1) receives the $Q_{max}$ value data calculated in method step 604 for each data group for each machine in which partial discharge data was collected.

Method portion 600 further includes a method step 608 further sorting the database of PD characteristics data and additional PD evaluation data as well as hydrogen pressure data with respect to electrical machine operational classifications. Such PD data has previously been sorted into predetermined PD source identification classifications as described above. In the exemplary embodiment, the PD and hydrogen data are further sorted with respect to one electrical machine operational classification, that is, specifically, a plurality of ranges of the voltage ratings of the machines. More specifically, each of the machines sampled for partial discharge data as described above includes a voltage rating rounded to the nearest kilovolt (kV). The ranges of voltage ratings include 10-12 $kV_{rms}$, 13-15 $kV_{rms}$, 16-18 $kV_{rms}$, and 19-30 $kV_{rms}$, wherein the voltages are determined by root mean square (rms) calculations. Alternatively, any operational parameter of the machines partitioned into any range of parameters is used that facilitates operation of system 100 as described herein. Therefore, the PD and hydrogen data received and evaluated as well as the PD data calculated as described above is resident within the database sorted into the aforementioned electrical machine voltage ratings.

Method portion 600 also includes a method step 610 generating a plurality of percentile transfer functions. In the exemplary embodiment, at least one percentile transfer function is determined for each range of voltage ratings described above. Also, in the exemplary embodiment, each percentile transfer function is determined to calculate at least one $Q_{max}$ level as a function of the measured hydrogen pressure in the sampled machine while collecting the PD data. The hydrogen pressure measurements are collected via at least one of sensors 120 and processor 124 (both shown in FIG. 1) in conjunction with the PD data and stored within the database. Specifically, in the exemplary embodiment, seven percentile transfer functions are determined for each range of voltage ratings. Further, specifically, the seven percentile transfer functions that are determined include $Q_{max\ Avg}$, $Q_{max\ Max}$, $Q_{max\ 25\%}$, $Q_{max\ 50\%}$, $Q_{max\ 75\%}$, $Q_{max\ 90\%}$, and $Q_{max\ 95\%}$.

$Q_{max\ Avg}$ is defined as the arithmetical average of the PD $Q_{max}$ data collected on all of the other machines within a particular range of voltage ratings. One purpose of calculating $Q_{max\ Avg}$ is to determine an average $Q_{max}$ value of all of the machines within a particular range of voltage ratings. Subsequently, a qualitative and quantitative comparison of PD data collected from machine of interest 118 (shown in FIG. 1) can be made with the PD data collected from all of the machines within the particular range of voltage ratings. For example, if a $Q_{max}$ value determined for machine of interest 118 is less than the $Q_{max\ Avg}$ value determined for machines in the particular range of voltage ratings in which machine 118 falls within, a qualitative assessment can be made that machine's 118 partial discharge activity is lower than average for that voltage rating. Likewise, if a $Q_{max}$ value determined for machine of interest 118 is greater than the $Q_{max\ Avg}$ value determined for machines in the particular range of voltage ratings in which machine 118 falls within, a qualitative assessment can be made that machine's 118 partial discharge activity is greater than average for that voltage rating.

$Q_{max\ Max}$ is defined as the mathematical maximum value of the PD $Q_{max}$ data collected on all of the other machines within a particular range of voltage ratings. One purpose of calculating $Q_{max\ Max}$ is to determine a maximum $Q_{max}$ value of all of the machines within a particular range of voltage ratings. Subsequently, a qualitative and quantitative comparison of PD data collected from machine of interest 118 can be made with the PD data collected from all of the machines within the particular range of voltage ratings. For example, if a $Q_{max}$ value determined for machine of interest 118 is less than the $Q_{max\ Max}$ value determined for machines in the particular range of voltage ratings in which machine 118 falls within, a qualitative assessment can be made that machine's 118 partial discharge activity is lower than the maximum for that voltage rating. Likewise, if a $Q_{max}$ value determined for machine of interest 118 is greater than the $Q_{max\ Max}$ value determined for machines in the particular range of voltage ratings in which machine 118 falls within, a qualitative assessment can be made that machine's 118 partial discharge activity is greater than the maximum for that voltage rating.

$Q_{max\ 25\%}$ is defined as the mathematical maximum value of the PD $Q_{max}$ data collected from at least some of the other machines within the lowest quartile of all of the other machines within a particular range of voltage ratings. One purpose of calculating $Q_{max\ 25\%}$ is to determine a $Q_{max}$ value associated with all of the machines within a particular range of voltage ratings that defines the lower quartile of such machines with respect to PD activity. Subsequently, a qualitative and quantitative comparison of PD data collected from machine of interest 118 can be made with the PD data collected from all of the machines within the particular range of voltage ratings. For example, if a $Q_{max}$ value determined for machine of interest 118 is less than the $Q_{max\ 25\%}$ value determined for machines in the particular range of voltage ratings in which machine 118 falls within, a qualitative assessment can be made that machine's 118 partial discharge activity is within the lower quartile of machines within that range of voltage ratings. Likewise, if a $Q_{max}$ value determined for machine of interest 118 is greater than the $Q_{max\ 25\%}$ value determined for machines in the particular range of voltage ratings in which machine 118 falls within, a qualitative assessment can be made that machine's 118 partial discharge activity is above the lower quartile of machines within that range of voltage ratings.

Similarly, $Q_{max\ 50\%}$, $Q_{max\ 75\%}$, $Q_{max\ 90\%}$, and $Q_{max\ 95\%}$ are defined as the mathematical maximum value of the PD $Q_{max}$ data collected from at least some of the other machines for half, three quarters, 90%, and 95% of all of the other machines within a particular range of voltage ratings, respectively. Subsequently, a qualitative and quantitative comparison of PD data collected from machine of interest 118 can be made with the PD data collected from all of the machines within the particular range of voltage ratings. For example, if a $Q_{max}$ value determined for machine of interest 118 is less than the $Q_{max\ 95\%}$ value determined for machines in the particular range of voltage ratings in which machine 118 falls within, a qualitative assessment can be made that machine's 118 partial discharge activity is within 95% of machines within that range of voltage ratings. Likewise, if a $Q_{max}$ value determined for machine of interest 118 is greater than the $Q_{max\ 95\%}$ value determined for machines in the particular range of voltage ratings in which machine 118 falls within, a qualitative assessment can be made that machine's 118 partial discharge activity is above 95% of machines within that range of voltage ratings.

In the exemplary embodiment, all of the percentile transfer functions are determined by mathematically "backfitting" and/or "curve fitting" the $Q_{max}$ data collected for all of the machines within a particular range of voltage ratings, each machine having a measured hydrogen pressure at the time of PD data collection. Alternatively, any method of mathematically determining the percentile transfer function that facilitates operation of system 100 as described herein is used. Each determined percentile transfer function is programmed into module 104 for use within module 102. The results of each of the $Q_{max\ Avg}$, $Q_{max\ Max}$, $Q_{max\ 25\%}$, $Q_{max\ 50\%}$, $Q_{max\ 75\%}$, $Q_{max\ 90\%}$, and $Q_{max\ 95\%}$ determinations is stored within logger module 108.

Figure 8:
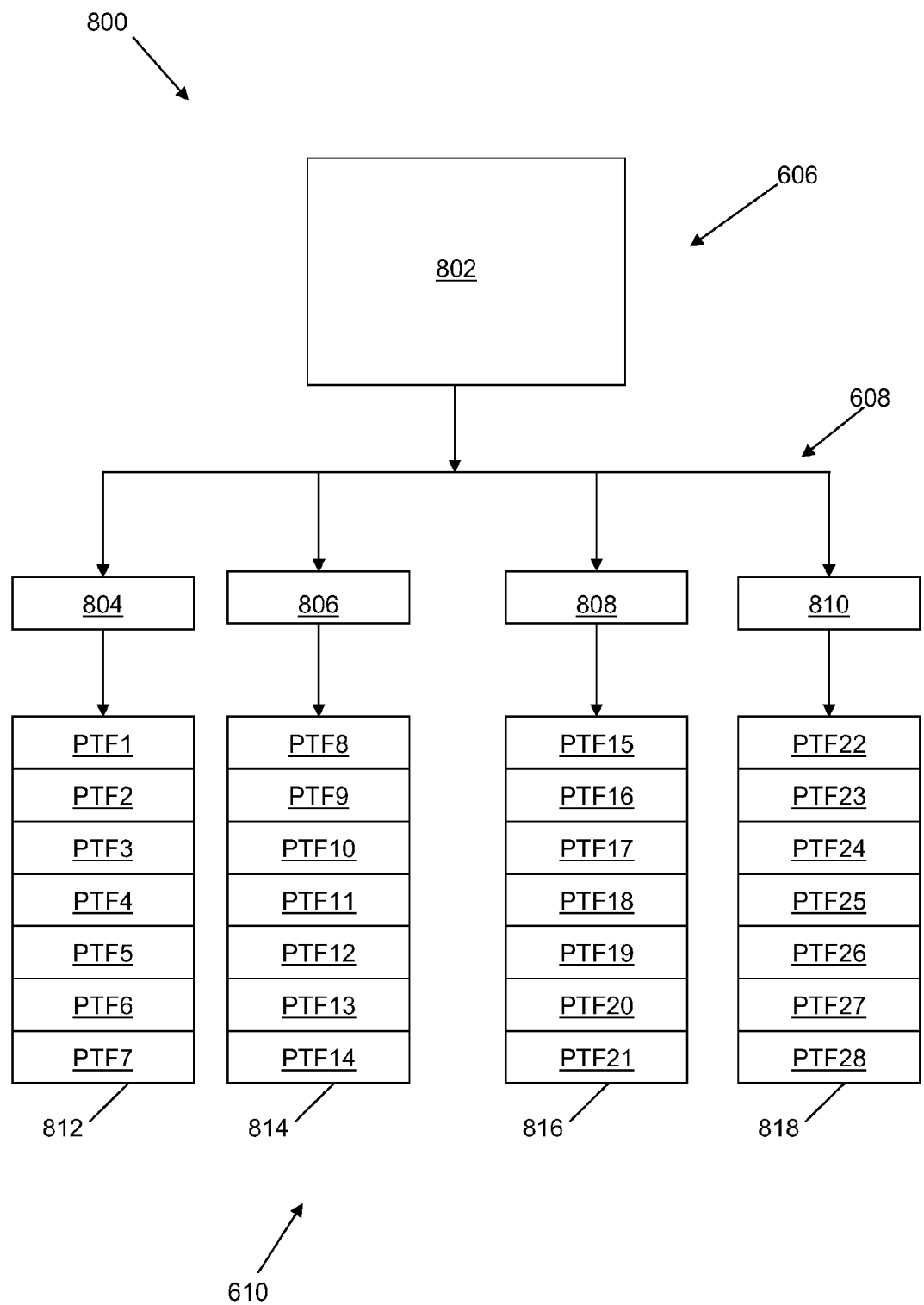
FIG. 8 is a flow chart illustrating an expanded portion of the method shown in FIG. 6.

FIG. 8 is a flow chart 800 illustrating an expanded portion of method portion 600 shown in FIG. 6. Specifically, flow chart 800 further illustrates method steps 606, 608, and 610 (shown in FIG. 6) described above. Flow chart 800 includes at least a portion of the database electronically maintained within logger module 108 (shown in FIG. 1). Specifically, flow chart 800 includes $Q_{max}$ value data 802 calculated in method step 604 (shown in FIG. 6) and transmitted to the database in method step 608 for each data group for each machine in which partial discharge data was collected.

Flow chart 800 also includes a plurality of database sorting criteria. Specifically, flow chart 800 includes a plurality of voltage rating range sorting criteria for each predetermined range of electrical machine voltage ratings. Specifically, flow chart 800 includes 10-12 $kV_{rms}$ voltage rating range sorting criteria 804, 12-15 $kV_{rms}$ voltage rating range sorting criteria 806, 16-18 $kV_{rms}$ voltage rating range sorting criteria 808, and 19-30 $kV_{rms}$ voltage rating range sorting criteria 810. Criteria 804, 806, 808 and 810 facilitate method step 608 wherein $Q_{max}$ value data 802 and hydrogen pressures (not shown) resident within the database are sorted into the aforementioned electrical machine voltage ratings.

Flow chart 800 further includes a plurality of percentile transfer functions developed per method step 610 as described above. Specifically, a plurality of percentile transfer functions 812 are calculated for the 10-12 $kV_{rms}$ voltage rating range using the hydrogen pressure data recorded and stored as described above. Plurality of percentile transfer functions 812 includes a first percentile transfer function PTF1 that is determined as described above in the form of at least one algorithm that substantially describes the behavior of $Q_{max\ Avg}$ values as a function of hydrogen pressure for machines with a voltage rating within the 10-12 kV$_{rms}$ range. An exemplary expression for PTF1 is $$Q_{max\ Avg}(mV)=-0.0015*x^3+0.1894*x^2-8.2371*x+137.14 \quad (1)$$

wherein x is a variable representing hydrogen pressure measured at the time of PD data collection in units of kilopascal (kPa) and/or pounds per square inch (psi).

Similarly, plurality of percentile transfer functions 812 includes a second percentile transfer function PTF2 that is determined as described above in the form of at least one algorithm that substantially describes the behavior of $Q_{max\ Max}$ values as a function of hydrogen pressure for machines with a voltage rating within the 10-12 kV$_{rms}$ range. An exemplary expression for PTF2 is $$Q_{max\ Max}(mV)=-0.0115*x^3+1.3731*x^2-56.366*x+808.71 \quad (2)$$

wherein, again, x is a variable representing hydrogen pressure measured at the time of PD data collection in units of kilopascal (kPa) and/or pounds per square inch (psi).

Accordingly, plurality of percentile transfer functions 812 calculated for the 10-12 kV$_{rms}$ voltage rating range includes functions PTF3 through PTF7 representing mathematical expressions for $Q_{max\ 25\%}$, $Q_{max\ 50\%}$, $Q_{max\ 75\%}$, $Q_{max\ 90\%}$, and $Q_{max\ 95\%}$, respectively. Further, accordingly, flow chart 800 further includes additional pluralities of percentile transfer functions 814, 816 and 818 calculated for the 12-15 kV$_{rms}$, 15-18 kV$_{rms}$, and 19-30 kV$_{rms}$ voltage rating ranges, respectively. Functions 814 include PTF8 through PTF14, functions 816 include PTF15 through PTF21, and functions 818 include PTF22 through PTF28 wherein each of PTF1 through PTF28 have a general mathematical configuration of:

$$Q_{max\ abc}(mV)=-K_1*x^3+K_2*x^2-K_3*x+K_4 \quad (3)$$

wherein the subscript "abc" is a variable for Ave, Max, 25%, 50%, 75%, 90% and 95%, x is a variable representing hydrogen pressure measured at the time of PD data collection in units of kilopascal (kPa) and/or pounds per square inch (psi), and $K_1$ through $K_4$ represent a set of constants uniquely determined for each of PTF1 through PTF28. In general, the values for $Q_{max}$ represented in mV tend to increase in value from lowest to greatest values in order of 25%, 50%, Ave, 75%, 90%, 95%, and Max.

Referring again to FIG. 6, method portion 600 also includes a method step 612 calculating $Q_{max}$ levels as a function of hydrogen pressure. Method step 612 is accomplished using the plurality of percentile transfer functions determined in method step 610 as described above and the PD characteristics data and additional PD evaluation data determined in method steps 222 and 604. The PD data is transmitted through the electrical machine operational classification sorting mechanism as described in method step 608 above via criteria 804, 806, 808 and 810 (all shown in FIG. 8) to the associated plurality of percentile transfer functions 812, 814, 816 and 818, respectively, for the respective voltage rating range. Once the data is resident within the respective PTFs, the associated $Q_{max}$ values for $Q_{max\ Avg}$, $Q_{max\ Max}$, $Q_{max\ 25\%}$, $Q_{max\ 50\%}$, $Q_{max\ 75\%}$, $Q_{max\ 90\%}$, and $Q_{max\ 95\%}$ are determined within module 102 and transmitted for storage within the database resident within logger module 108. These $Q_{max}$ values form the basis for comparison of machine of interest 118 with other similar machines as described further below.

An exemplary method of analyzing partial discharge data collected from an electrical device includes collecting partial discharge data from a first electrical device 118 belonging to a group of electrical devices. The group of electrical devices is at least partially defined by at least one electrical device classification. The method also includes generating a comparison of at least a portion of the partial discharge data collected from first electrical device 118 with at least a portion of the partial discharge data collected from at least one second electrical device. The at least one second electrical device is selected from the group of electrical devices that includes first electrical device 118. The method further includes transmitting the results, which in the exemplary embodiment, is to at least one computer-readable medium, or specifically, output module 106.

Figure 9:
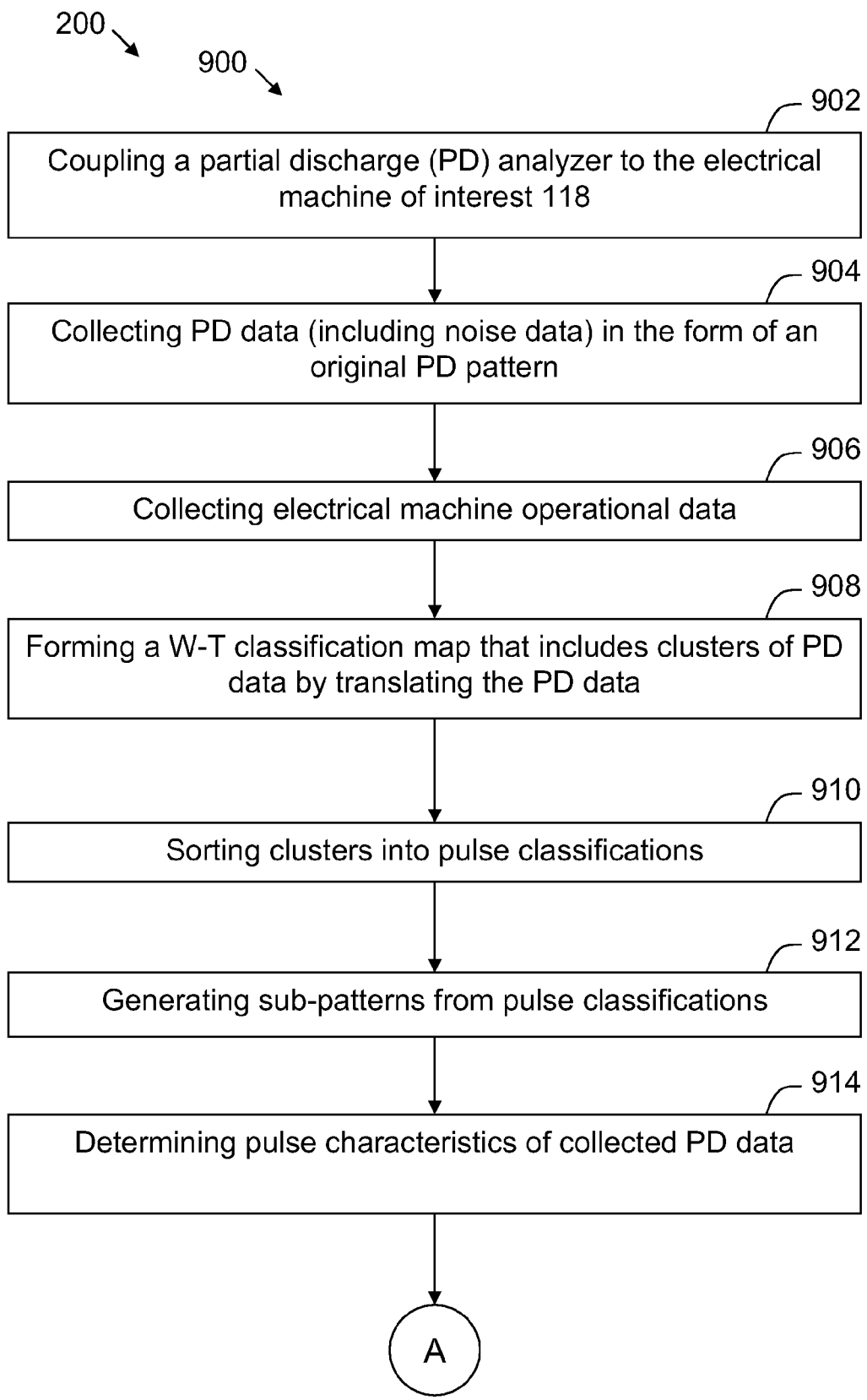
FIG. 9 is a flow chart illustrating a further portion of the method of operating the partial discharge analyzer system shown in FIG. 1.
Figure 10:
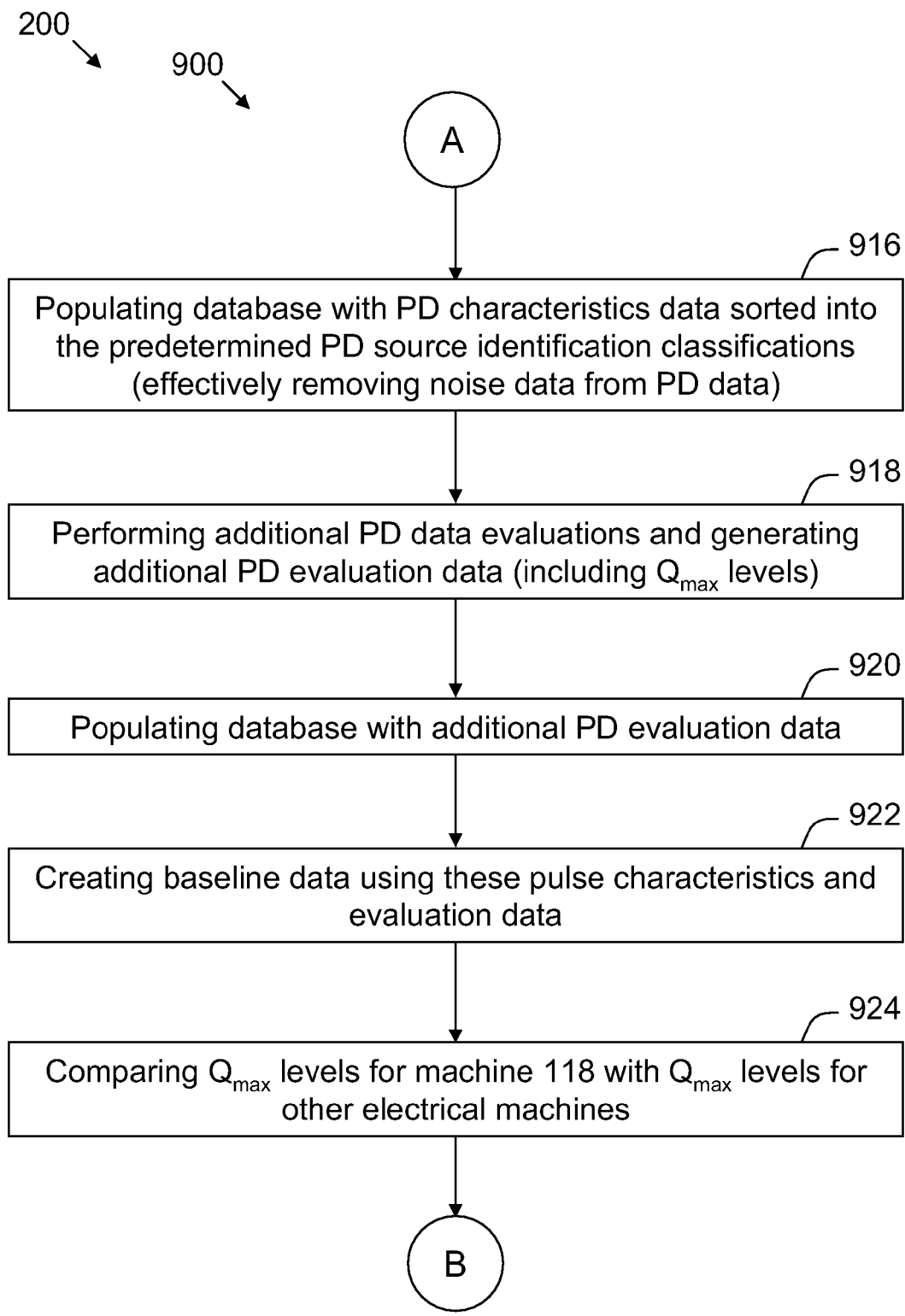
FIG. 10 is a continuation of the flow chart from FIG. 9.
Figure 11:
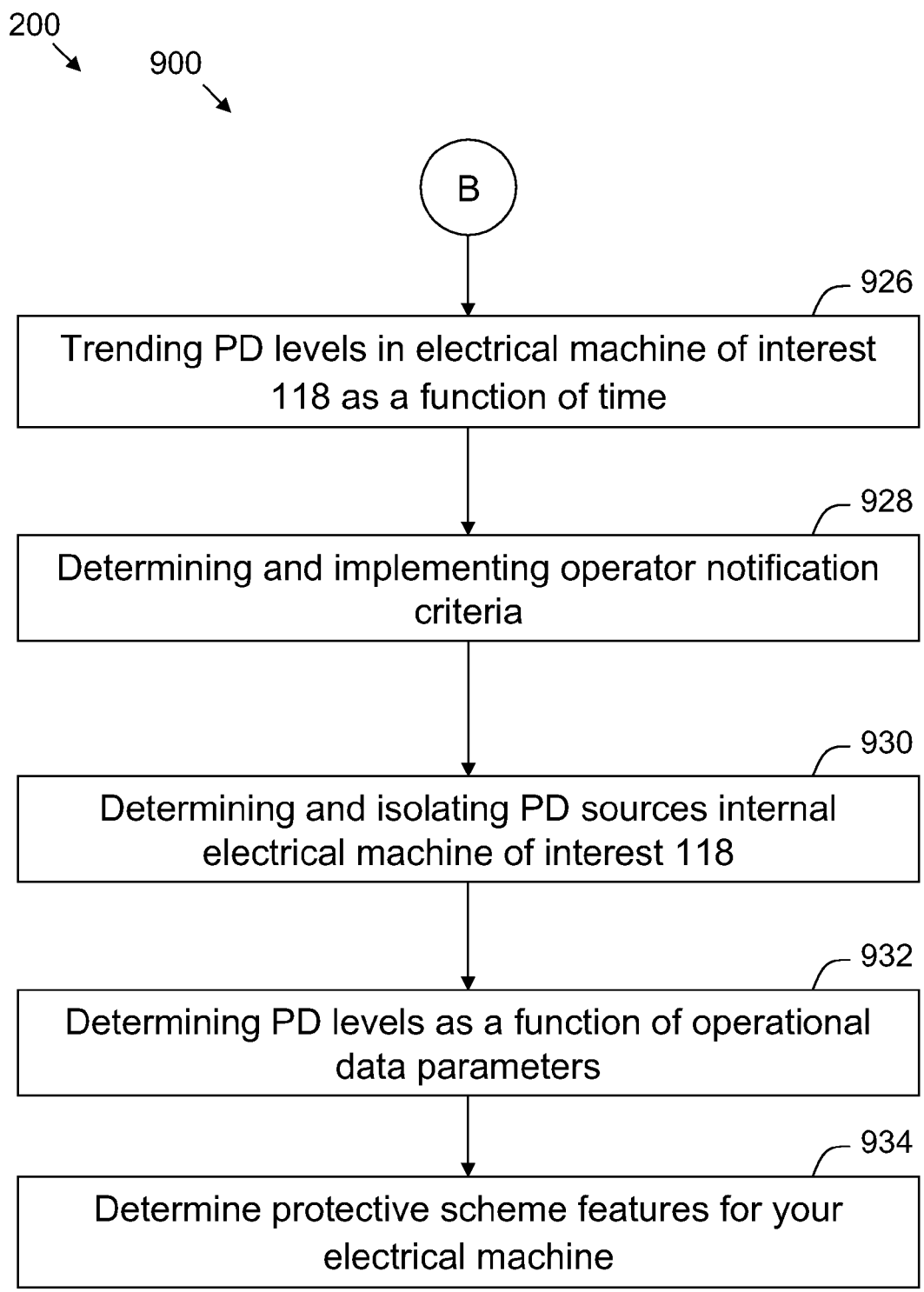
FIG. 11 is a continuation of the flow chart from FIG. 10.

FIG. 9 is a flow chart illustrating a further portion 900 of method 200 (portions shown in FIGS. 2 and 6) of operating on-line real-time partial discharge analyzer system 100 (shown in FIG. 1). FIG. 10 is a continuation of the flow chart from FIG. 9 and FIG. 11 is a continuation of the flow chart from FIG. 10. Method portion 900 includes a plurality of method steps for performing automatic continuous PD analysis of electrical machine of interest 118 (shown in FIG. 1). As such, method portion 900 includes a method step 902 coupling at least one partial discharge analyzer system 100 to electrical machine of interest 118. In the exemplary embodiment, machine of interest 118 has at least some similar design, construction and operational classifications, hereon referred to as machine classifications, to at least some other machines within the machine groups as described in method step 202 above. For example, each of such other machines is sorted into one of a plurality of groups that include, but are not limited to, water-cooled electric power generators, hydrogen-cooled electric power generators, and air-cooled electric power generators, and/or combinations thereof. Moreover, such groups may include, but not be limited to, air-cooled electric motors. Alternatively, machine of interest 118 is a unique electrical device wherein qualitative assessments of similarity and dissimilarity of each of the unique features associated with machine 118 are conducted such that at least some of the PD data collected and determined in method portion 600 (shown in FIG. 6) as described above can be used to evaluate machine 118. In the exemplary embodiment, step 902 includes permanently coupling one of system 100 to machine 118. Alternatively, method 902 includes temporarily coupling one of system 100 to machine 118. Further, alternatively, any method of collecting PD data that facilitates analysis as described herein is used.

Method portion 900 also includes a method step 904 collecting PD data (including noise data) from electrical machine of interest 118 in the form of an original PD pattern with noise data as described further below. Graph 300 (shown in FIG. 3) as described above represents a typical PD pattern associated with machine 118. Partial discharge pulses 314 (shown in FIG. 3) are generated based on conditions that include, but are not limited to, the material condition of the insulation, operating conditions of machine 118, and environmental conditions proximate to machine 118. Typically, pulses 314 include PD pulses within machine 118, PD pulses from devices (not shown) electrically coupled to bus 116 (shown in FIG. 1) that are external to machine 118, and noise pulses that originate from sources that include, but are not limited to, proximate electro-magnetic fields and commutation, radio frequency interference, and electrical power supply power quality deficiencies.

Method portion 900 further includes a method step 906 collecting electrical machine 118 operational data via sensors 120 and processor 124 (both shown in FIG. 1). Specifically, step 906 includes operational data collected substantially instantaneously with the PD data collected in step 904 as described above. Such operational data is transmitted to module 102 and includes, but is not limited to, machine voltage, machine MW, machine KVA, machine reactive power (in Megavolt-Amperes Reactive (MVAR)), machine temperatures and hydrogen pressure.

Method portion 900 also includes a method step 908 forming a W-T classification map. Step 908 includes forming clusters of PD data (including noise data) by translating the PD data (including noise data) collected in step 904. Step 908 is substantially similar to method step 216 as described above. Associated histogram 403 (shown in FIG. 4) is electronically stored within logger module 108. Similarly, associated classification map 500 (shown in FIG. 5) is electronically stored within logger module 108.

Method portion 900 further includes a method step 910 sorting each of the plurality of clusters 504, 506, 508, and 510 (shown in FIG. 5) into pulse classifications, derived as described above in method step 218 (shown in FIG. 2). As discussed above, noise pulses tend to exhibit similar characteristics as other noise pulses such that the associated noise pulse pixels tend to group in proximity to each other. Similarly, PD pulses having similar characteristics as other PD pulses tend to also group in proximity to each other, wherein PD pulses generated within the same defect tend to exhibit similar shapes. Therefore, clusters 504, 506, 508, and 510 are classified by the characteristics of each type of pulse in received plurality of pulses 404 (shown in FIG. 4). Such classification is performed within module 102 using rules resident within module 104, and such classification is stored within logger module 108 (all shown in FIG. 1). Further analysis is performed in a manner substantially similar to that described above for method step 218 within module 102 using rules resident within module 104, and the results of such further analysis are stored within logger module 108.

Method portion 900 also includes a method step 912 generating sub-patterns (including noise data) from the pulse classifications determined in step 910. Method step 912 is substantially similar to method step 220 (shown in FIG. 2) described above and is performed using modules 102 and 104 and the results are electronically stored within logger module 108.

Method portion 900 further includes a method step 914 determining pulse characteristics of collected PD data (including noise data) from electrical machine of interest 118. Method step 914 is substantially similar to method step 222 (shown in FIG. 2) as discussed above. Similarly, method step 914 is performed using modules 102 and 104 and the results are electronically stored within logger module 108.

Method portion 900 also includes a method step 916 populating the database with the PD characteristics data determined in method step 914 as described above. Method step 916 is substantially similar to method step 224 (shown in FIG. 2) as described above. Such PD data is sorted into the PD source identification classifications determined per method step 208 (shown in FIG. 2) as described above and stored within logger module 108. Such sorting effectively separates the noise data from the PD data. Similarly, operation parameter data, including hydrogen pressure data, collected during collection of the PD data is also stored within the database for further use as described below.

Method portion 900 further includes a method step 918 performing additional PD data evaluations and generating additional PD evaluation data that is substantially similar to method step 604 (shown in FIG. 6) as discussed above. Each group of PD pulse data previously recorded within the steps described above and stored within logger module 108 is further evaluated by performing calculations within module 102 using rules resident within module 104. Specifically, in the exemplary embodiment, method step 916 determines $Q_{max}$ values as described above in units of mV.

Method portion 900 also includes a method step 920 populating the database with the additional PD evaluation data determined in method step 918 as described above. Specifically, the database electronically maintained within logger module 108 receives the $Q_{max}$ value data calculated in method step 918.

Method portion 900 further includes a method step 922 creating baseline data using the pulse characteristics and evaluation data. The data collected and the subsequent evaluations and determinations as described above thus far in portion 900 are stored within the database residing in logger module 108. Moreover, such data may be designated baseline data by the operator for further analyses and comparisons as discussed further below.

Method portion 900 also includes a method step 924 comparing $Q_{max}$ levels for machine of interest 118 with $Q_{max}$ levels for the other electrical machines. The $Q_{max}$ levels determined in method step 916 as described above are compared to the $Q_{max\ Ave}$, $Q_{max\ Max}$, $Q_{max\ 25\%}$, $Q_{max\ 50\%}$, $Q_{max\ 75\%}$, $Q_{max\ 90\%}$, and $Q_{max\ 95\%}$ values determined for the other machines within the electrical machine operational classification (as described in method step 610 (shown in FIG. 6) above) that machine of interest 118 is grouped within. Specifically, machine 118 is compared with the other machines having a similar voltage rating within one of the 10-12 $kV_{rms}$, 12-15 $kV_{rms}$, 16-18 $kV_{rms}$, and 19-30 $kV_{rms}$ voltage rating ranges. More specifically, the $Q_{max}$ levels determined in method step 916 for machine of interest 118 are compared to the existing $Q_{max}$ values for one of PTF1-PTF7, PTF8-PTF14, PTF15-PTF21, or PTF22-PTF28 as determined in method step 610, wherein these PCTs facilitates generation of the $Q_{max\ Ave}$, $Q_{max\ Max}$, $Q_{max\ 25\%}$, $Q_{max\ 50\%}$, $Q_{max\ 75\%}$, $Q_{max\ 90\%}$, and $Q_{max\ 95\%}$ values for the associated voltage range rating. Once the comparison is performed, machine of interest 118 is ranked with the other similar machines as a function of placement within the predetermined percentiles ($Q_{max\ Ave}$, $Q_{max\ Max}$, $Q_{max\ 25\%}$, $Q_{max\ 50\%}$, $Q_{max\ 75\%}$, $Q_{max\ 90\%}$, and $Q_{max\ 95\%}$). For example, if the $Q_{max}$ levels determined in method step 916 are approximately 150 mV, and the $Q_{max\ Ave}$, $Q_{max\ Max}$, $Q_{max\ 25\%}$, $Q_{max\ 50\%}$, $Q_{max\ 75\%}$, $Q_{max\ 90\%}$, and $Q_{max\ 95\%}$ values for the associated voltage range rating are 155 mV, 750 mV, 45 mV, 169 mV, 375 mV, 500 mV, and 700 mV, respectively, machine of interest is considered to be approximately average and just slightly within the top half of the other measured machines.

Figure 12:
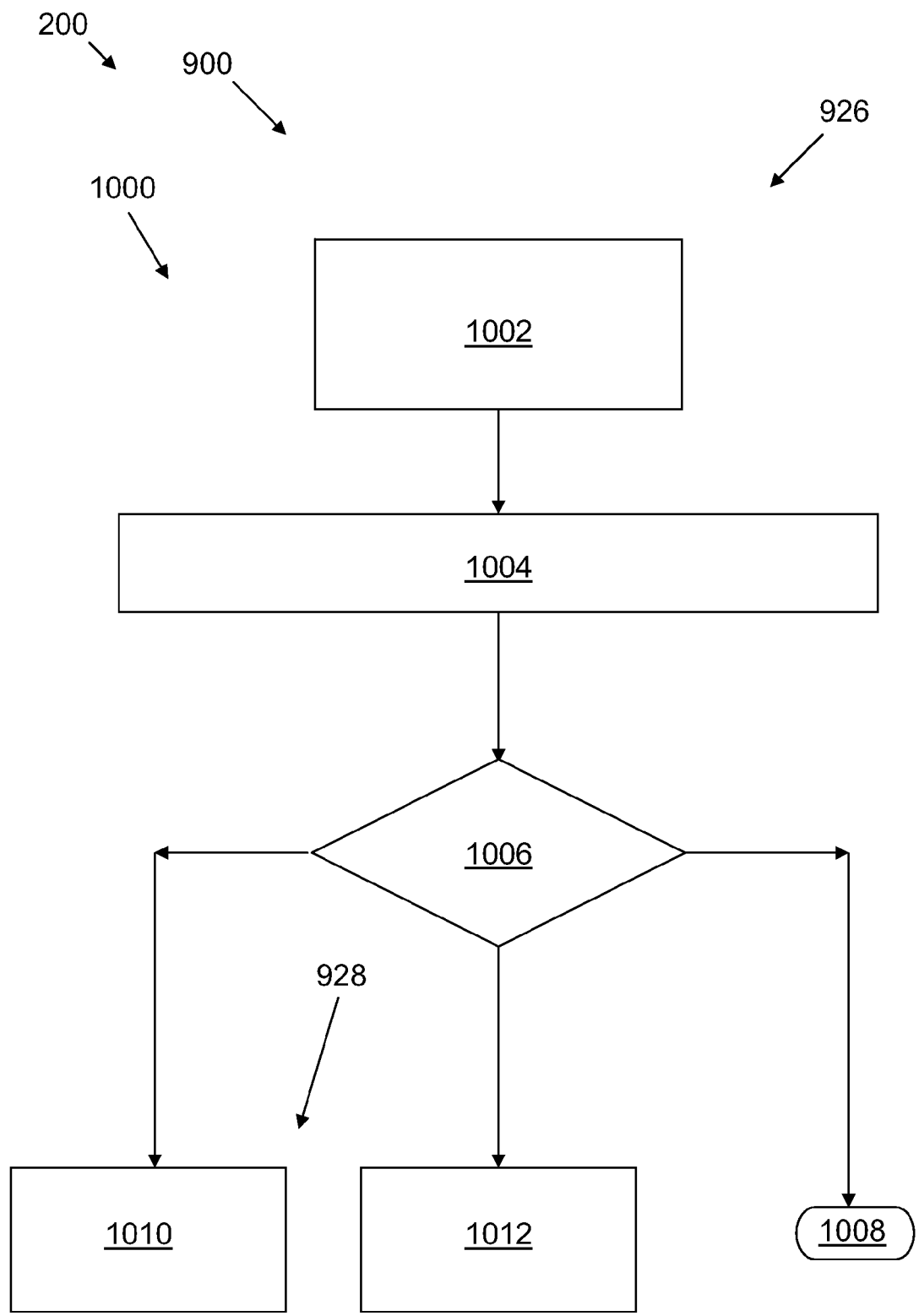
FIG. 12 is a flow chart illustrating trending and notification features that may be used with the partial discharge analyzer system shown in FIG. 1.

Method portion 900 further includes a method step 926 trending PD levels in electrical machine of interest 118 as a function of time. FIG. 12 is a flow chart 1000 illustrating trending and notification features that may be used with partial discharge analyzer system 100 (shown in FIG. 1). Flow chart 1000 includes at least a portion of the database electronically maintained within logger module 108 (shown in FIG. 1). Specifically, flow chart 1000 includes $Q_{max}$ value data 1002 calculated in method step 918 (shown in FIG. 10) and transmitted to the database in method step 920 for machine 118. In the exemplary embodiment, flow chart 1000 includes a trend determination function block 1004 that is coupled in electronic data communication with data 1002. Function block 1004 is configured to receive data transmitted from data 1002 and includes at least one algorithm to calculate trends associated with $Q_{max}$ value data 1002 over a predetermined period of time. In the exemplary embodiment, function block 1004 calculates a rate of change of $Q_{max}$ value data 1002 over a six month period of time. Alternatively, any period of time that facilitates operation of system 100 as described herein is used. The analog algorithm used within function block 1004 is:

$$Q_{max}(\text{now})/Q_{max}(\text{six months ago}) = \text{Ratio of change of } Q_{max} \text{ data} \quad (4)$$

Wherein algorithm (4) is resident within module 104, execution of the algorithm is performed within module 102, and the resultant ratio is transmitted to both logger module 108 and output module 106 (all shown in FIG. 1). Moreover, algorithm (4) is configured within system 100 to update on a substantially continuous basis automatically with the limitations being the scan rate of system 100 (typically measured in milliseconds) and the sampling rate of sensor 110 (shown in FIG. 1).

Flow chart 1000 also includes a discrete functional logic block 1006 that is coupled in electronic data communication with function block 1004. Logic block 1006 is configured to receive and compare the ratio determined and transmitted by algorithm (4) above with the number 2, wherein logic block 1006 determines if the $Q_{max}$ magnitude has doubled. Flow chart 1000 further includes a discrete "end" functional logic block 1008 that is coupled in electronic data communication with logic block 1006. In the exemplary embodiment, if the $Q_{max}$ magnitude has not doubled over the last six months, a discrete signal is transmitted to logic block 1008 and operation of the associated trending feature illustrated in flow chart 1000 is terminated via logic block 1008 for a predetermined period of time. Alternatively, the trending feature illustrated in flow chart 1000 is configured to operate continuously while machine 118 is in service.

Referring again to FIG. 11, method portion 900 further includes a method step 928 determining and implementing operator notification criteria and set operator notifications. Referring again to FIG. 12, flow chart 1000 also includes a discrete notification function block 1010 that is coupled in electronic data communication with logic block 1006 wherein function block 1010 facilitates notification of an operator in the event that $Q_{max}$ magnitude has at least doubled over the last six months based on a discrete signal transmitted from logic block 1006. Such notification may be facilitated by methods that include, but are not limited to, initiating pop-up alarms on operator consoles, energizing audible control room alarms, and energizing annunciator windows. Flow chart 1000 further includes an analog notification function block 1012 that is coupled in electronic data communication with logic block 1006 wherein function block 1012 facilitates display of information that includes current $Q_{max}$ magnitudes, percentile ranking, and rate of change of $Q_{max}$ that is transmitted as analog signals from logic block 1006. In the exemplary embodiment, function block 1012 is in continuous operation. Alternatively, function block 1012 is placed in service at a predetermined periodicity.

Figure 13:
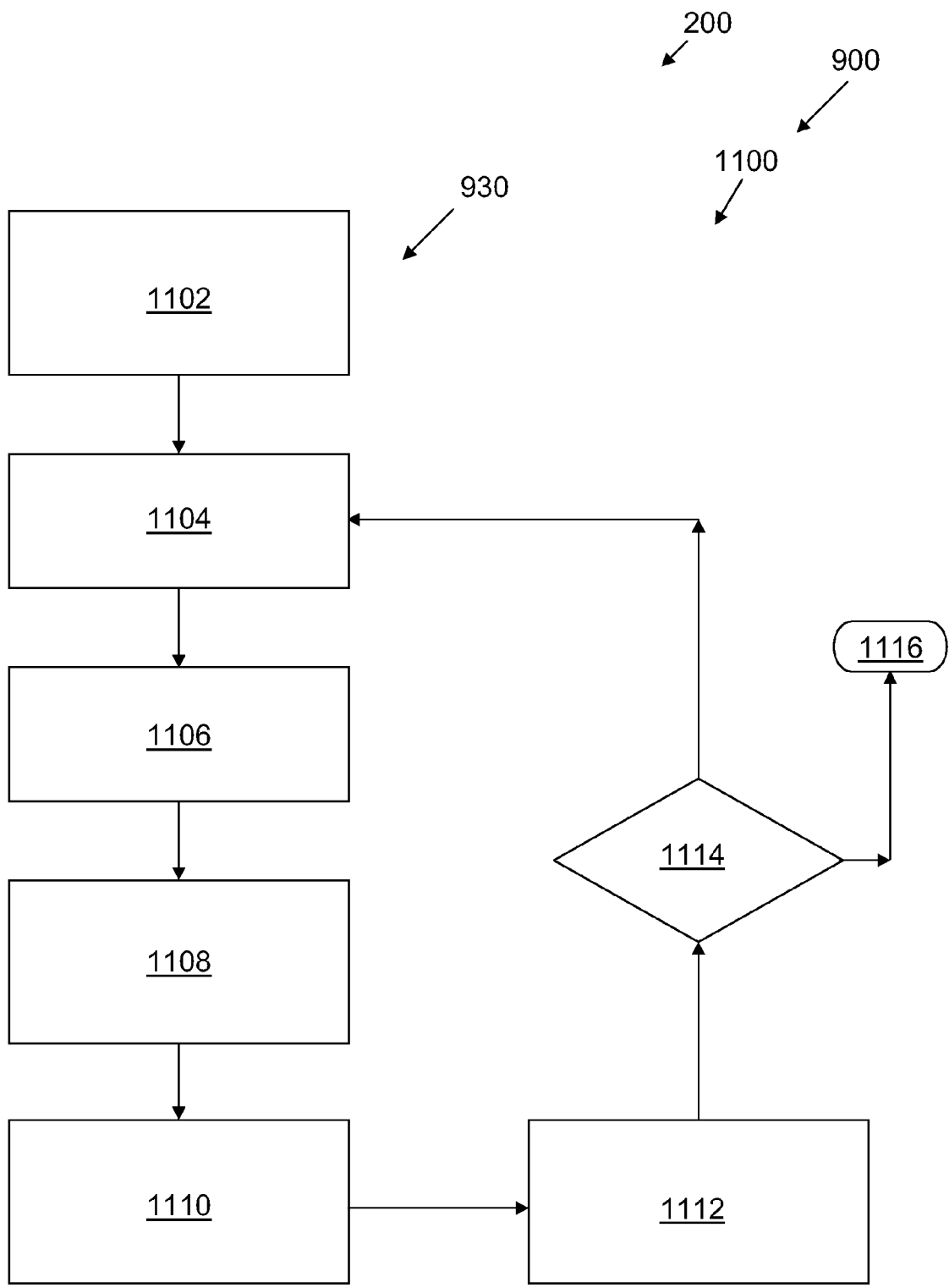
FIG. 13 is a flow chart illustrating machine partial discharge source identification features that may be used with the partial discharge analyzer system shown in FIG. 1.

Method portion 900 further includes a method step 930 determine and isolate PD sources internal to electrical machine of interest 118. The data within the database resident in logger module 108 contains evaluated and analyzed data with sufficient rules within module 104 to facilitate determination of PD sources by module 102 (all shown in FIG. 1) as a function of the determined PD pulse characteristics. Specifically, FIG. 13 is a flow chart 1100 illustrating machine partial discharge source identification features that may be used with partial discharge analyzer system 100 (shown in FIG. 1). Flow chart 1100 includes at least a portion of the database 1102 electronically maintained within logger module 108 (shown in FIG. 1). Flow chart 1100 also includes a data selection function block 1104 that is coupled in electronic data communication with database portion 1102. Function block 1104 is configured to select, receive and transmit partial discharge data collected from machine 118 based on a predetermined sequence. For example, in operation, function block 1104 transmits a first selection of PD data collected with determined pulse characteristics that include, but are not limited to, magnitude, polarity, phase, and time of occurrence, as described in method steps 904 through 916 (all shown in FIG. 9) and that are used to facilitate determining PD source identification and type. Such first and subsequent selections of PD data are typically determined based on their classifications that include, but are not limited to, corona discharges, surface discharges, internal discharges, invalid data, noise, and unknown causes.

Flow chart 1100 further includes a pulse characteristic function block 1106 coupled in electronic data communication with function block 1104 that is configured to receive the data transmitted from function block 1104 and determine magnitudes and/or values associated with the pulse characteristics described above. Such determinations are facilitated by using W-T domain analysis and PRPDA, both as described above.

Flow chart 1100 also includes an additional PD data evaluation function block 1108 that is coupled in electronic data communication with function block 1106. Function block 1108 is configured to receive classification data transmitted from function block 1106 and determine additional PD data evaluations in a manner substantially similar to that described for method step 918 (shown in FIG. 10). As discussed above, a variety of statistical analyses are available for evaluating the pulse data and a finite number of such analyses are selected for the exemplary pulse data. In the exemplary embodiment, such analyses selected include, but are not limited to, determinations of values for $Q_{max}$, NQN, $N_w$, a Weibull distribution, and a kurtosis of phase distribution. Such analyses further include statistical analysis of amplitude and phase distributions, for example, but not limited to, a mean phase angle of a pulse pattern, a phase spread of a pulse pattern, and a variance of pulse amplitude distribution. In the exemplary embodiment, $Q_{max}$ is the primary parameter used for further evaluation of pulse data.

Flow chart 1100 further includes a PD location and type function block 1110 that is coupled in electronic data communication with function block 1108. Function block 1110 is configured to receive the plurality of data transmitted from function block 1108 and determine a location and type of the PD activity associated with the first selection of PD data collected from machine 118. Function block 1110 is also configured to use rules programmed within module 104 (shown in FIG. 1) that are at least partially based on PRPDA pattern data published by the International Council on Large Electric Systems (CIGRE).

Flow chart 1100 also includes an additional identification analysis function block 1112 that is coupled in electronic data communication with function block 1110. Function block 1112 is configured to receive location and type data transmitted from function block 1110 and is further configured to execute additional identification analysis. In the exemplary embodiment, results of such additional analysis includes, but is not limited to, determining if the PD pulse occurrence has a positive predominance (wherein the occurrence of partial discharge activity is predominately found during positive phase portions of the electrical phase cycles of machine 118) which indicates possible slot (not shown) PD activity. Also, such additional analysis includes determining if such PD activity has a +/−30° phase shift indicating the associated PD activity is possibly originating in the end windings (not shown) of machine 118. Furthermore, such additional analysis includes determining if such PD activity is coincident with other PD activity, thereby forming crosstalk conditions. Alternatively, any analysis of the PD data that facilitates operation of system 100 as described herein is used.

The aforementioned analyses are performed until each PD pulse classification within data 1002 is analyzed by function block 1112. Flow chart 1100 further includes a discrete functional logic block 1114 that is coupled in electronic data communication with functional function block 1112. Logic block 1114 is configured to determine if all of the classifications have been analyzed. If they have, a discrete signal is transmitted to a discrete "end" functional logic block 1116 that is coupled in electronic data communication with logic block 1114. Logic block 1116 is substantially similar to logic block 1008 (shown in FIG. 12). If there are remaining classifications within data 1102 to be analyzed, a discrete signal is transmitted to data selection function block 1104 to select, receive and transmit the next set of partial discharge data collected from machine 118.

Figure 14:
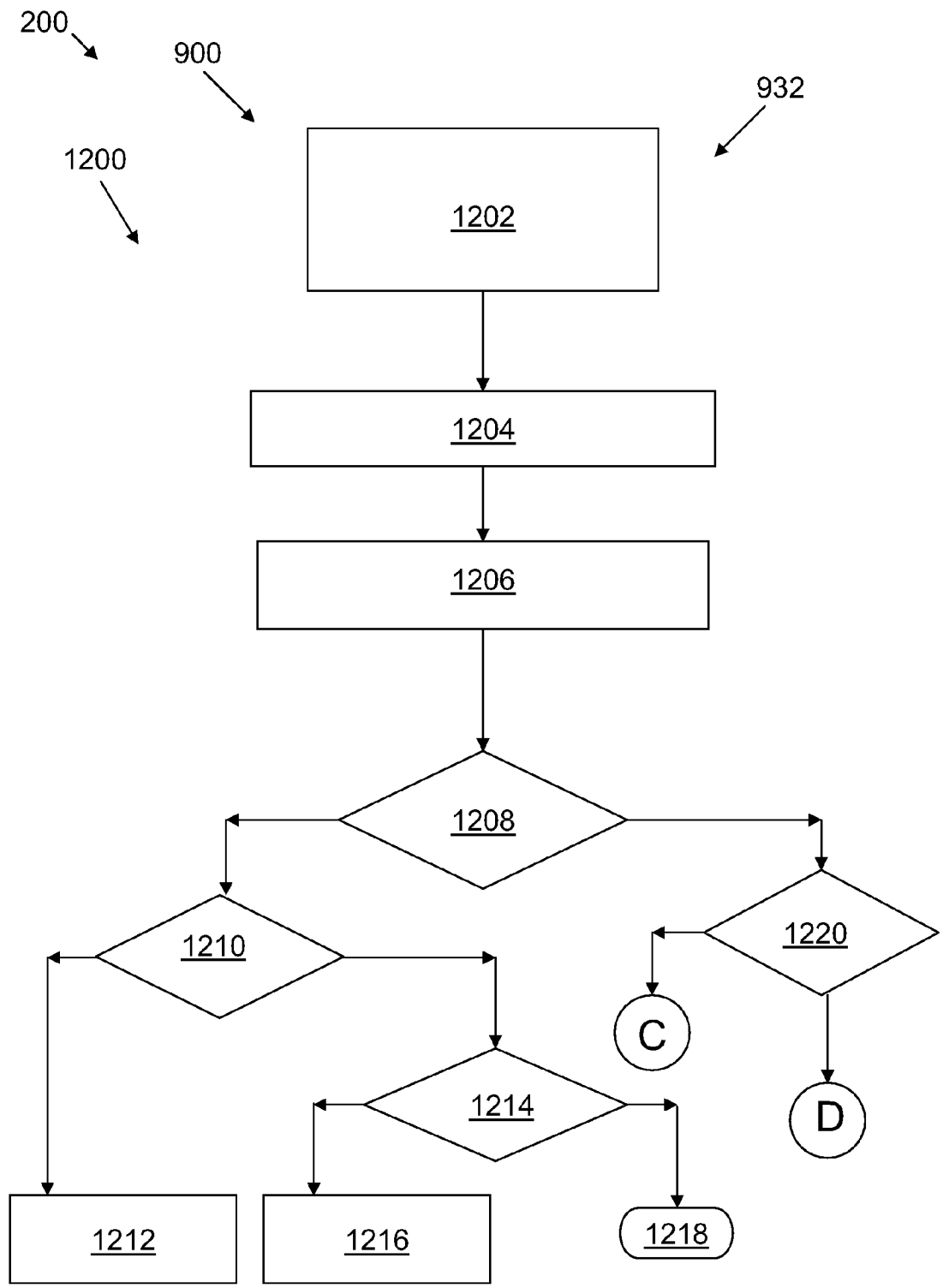
FIG. 14 is a flow chart illustrating determination features for partial discharge levels as a function of operational real and reactive power data that may be used with the partial discharge analyzer system shown in FIG. 1.
Figure 15:
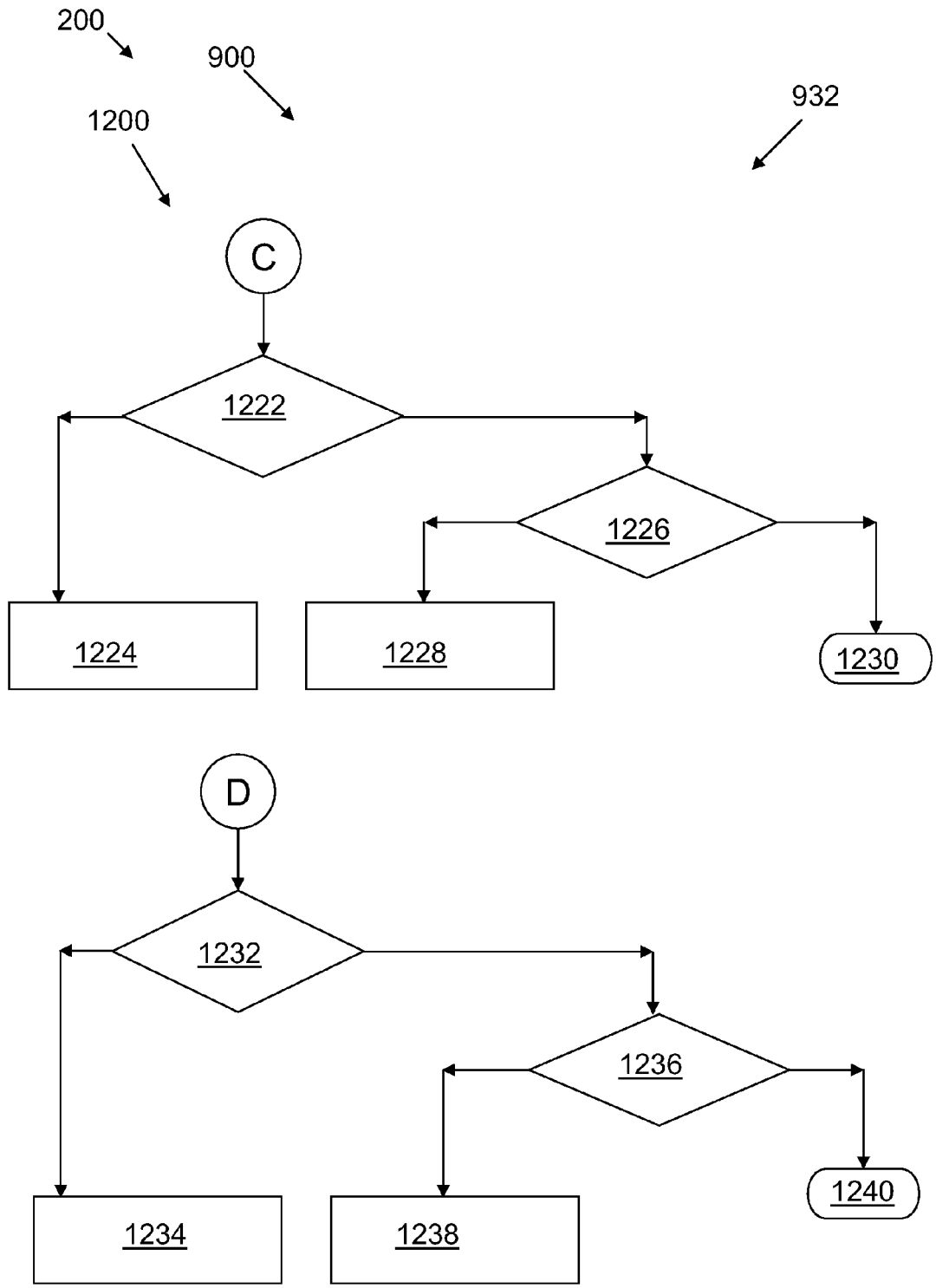
FIG. 15 is a continuation of the flow chart from FIG. 14.

Method portion 900 also includes a method step 932 determine PD levels as a function of operational data parameters. Operational parameters of machine of interest 118 include, but are not limited to, voltage, MW, MVAR, hydrogen pressure, and temperature. FIG. 14 is a flow chart 1200 illustrating determination features for partial discharge levels as a function of operational real and reactive power data that may be used with partial discharge analyzer system 100 (shown in FIG. 1). FIG. 15 is a continuation of the flow chart from FIG. 14. Flow chart 1200 includes at least a portion of the database 1202 electronically maintained within logger module 108 (shown in FIG. 1). Flow chart 1200 also includes a data selection and trending function block 1204 that is coupled in electronic data communication with database portion 1202.

Function block 1204 is configured to select, receive and transmit data from database portion 1202 that includes, but is not limited to, real power time-stamped data in units of MW collected from machine 118 based on a predetermined time period and time-stamped $Q_{max}$ data. Such $Q_{max}$ data may include classification and type data that is determined and evaluated as described above. In the exemplary embodiment, the $Q_{max}$ data is pulled from the database as a function of its W-T classification. Alternatively, any $Q_{max}$ data that facilitates operation of system 100 as described herein is pulled from the database. Also, in the exemplary embodiment, a one year limit is placed on the time frame evaluated. Alternatively, any time period over the life cycle of machine 118 is used. A substantially similar configuration is used for reactive power data recorded in units of MVAR, wherein the real power trending features are discussed hereon. Trending both MW and MVAR and comparing with recorded $Q_{max}$ facilitates detection of loose windings within machine 118.

Flow chart 1200 further includes a percentage change in $Q_{max}$ function block 1206 that is coupled in electronic data communication with function block 1204. Function block 1206 is configured to receive $Q_{max}$ data and MW data transmitted from function block 1204. Function block 1206 is also configured to determine at least two instances wherein measurements of real power transients associated with machine 118 that exceed 50% within the range of 0% to 100% of the real power rating of machine 118. Moreover, function block 1206 is configured to receive temperature, and hydrogen pressure from database portion 1202 wherein function block 1206 evaluates if a predetermined set of measured parameters that are known to affect partial discharge activity are substantially static during the time period evaluated. Specifically, in the exemplary embodiment, function block 1206 makes a determination if the measured temperature data is substantially constant at 50 degrees Celsius (° C.) (122 degrees Fahrenheit (° F.)) within a range of +/−5° C. (9° F.). Also, specifically, in the exemplary embodiment, function block 1206 makes a determination if the measured hydrogen pressure remains substantially constant within a +/−10% range of a first hydrogen pressure measurement. Alternatively, any process measurements known to affect partial discharge activity are determined to be substantially static or permitted to vary in a limited, predetermined range, are used. If the substantially static conditions are satisfied, a percentage change in $Q_{max}$ for substantially the same time period associated with the MW data is calculated and a signal representative of such percentage change is transmitted from function block 1206.

Flow chart 1200 also includes a positive predominance functional logic block 1208 that is coupled in electronic data communication with function block 1206 and is configured to receive the $Q_{max}$ percentage change signal that is transmitted from function block 1206. If the $Q_{max}$ data being evaluated via flow chart 1200 exhibits tendencies of positive predominance (wherein the occurrence of partial discharge activity is predominately found during positive phase portions of the electrical phase cycles of machine 118) a discrete "yes" signal is transmitted from logic block 1208. Otherwise, a discrete "no" signal is transmitted from logic block 1208.

Flow chart 1200 further includes a first delta $Q_{max}$ comparison functional logic block 1210 that is coupled in electronic data communication with logic block 1208 and is configured to receive the discrete "yes" signal that is transmitted from logic block 1208. Logic block 1210 is also configured to make a determination whether the percentage change in $Q_{max}$ signal transmitted from function block 1206 includes a value between 30% and 100%. If the percentage change in $Q_{max}$ falls within this range, a discrete "yes" signal is transmitted from logic block 1210. Otherwise, a discrete "no" signal is transmitted from logic block 1210.

Flow chart 1200 also includes a first notification function block 1212 that is coupled in electronic data communication with logic block 1210 and is configured to receive the discrete "yes" signal is transmitted from logic block 1210. Upon receipt of such signal, function block 1212 facilitates notification of an operator in the event that $Q_{max}$ magnitude has increased by 30% to 100% over the time period being evaluated. Such notification is indicative of potential slot-based partial discharge activity and may be facilitated by methods that include, but are not limited to, initiating pop-up alarms on operator consoles, energizing audible control room alarms, and energizing annunciator windows.

Flow chart 1200 further includes a second delta $Q_{max}$ comparison functional logic block 1214 that is that is coupled in electronic data communication with logic block 1210 and is configured to receive the discrete "no" signal that is transmitted from logic block 1210. Logic block 1214 is also configured to make a determination whether the percentage change in $Q_{max}$ signal transmitted from function block 1206 includes a value greater than 100%. If the percentage change in $Q_{max}$ has more than doubled, a discrete "yes" signal is transmitted from logic block 1214. Otherwise, a discrete "no" signal is transmitted from logic block 1214.

Flow chart 1200 also includes a second notification function block 1216 that is coupled in electronic data communication with logic block 1214 and is configured to receive the discrete "yes" signal that is transmitted from logic block 1214. Upon receipt of such signal, function block 1216 facilitates notification of an operator in the event that $Q_{max}$ magnitude has at least doubled over the time period being evaluated. Such notification is indicative of a high risk of slot-based partial discharge activity and may be facilitated by methods that include, but are not limited to, initiating pop-up alarms on operator consoles, energizing audible control room alarms, and energizing annunciator windows. Flow chart 1200 further includes a discrete "end" functional logic block 1218 that is coupled in electronic data communication with logic block 1214. Logic block 1218 is configured to end evaluation of this $Q_{max}$ data upon receipt of the discrete "no" signal transmitted by logic block 1214.

Flow chart 1200 also includes a negative predominance functional logic block 1220 that is coupled in electronic data communication with logic block 1208 and is configured to receive discrete "no" signal that is transmitted from logic block 1208. If the $Q_{max}$ data being evaluated via flow chart 1200 exhibits tendencies of negative predominance (wherein the occurrence of partial discharge activity is predominately found during negative phase portions of the electrical phase cycles of machine 118) a discrete "yes" signal is transmitted from logic block 1220. Otherwise, a discrete "no" signal is transmitted from logic block 1220.

Referring to FIG. 15, flow chart further includes a third delta $Q_{max}$ comparison functional logic block 1222 that is coupled in electronic data communication with logic block 1220 and is configured to receive the discrete "yes" signal that is transmitted from logic block 1220. Logic block 1222 is also configured to make a determination whether the percentage change in $Q_{max}$ signal transmitted from function block 1206 includes a value between 30% and 100%. If the percentage change in $Q_{max}$ falls within this range, a discrete "yes" signal is transmitted from logic block 1222. Otherwise, a discrete "no" signal is transmitted from logic block 1222.

Flow chart 1200 also includes a third notification function block 1224 that is coupled in electronic data communication with logic block 1222 and is configured to receive the discrete "yes" signal is transmitted from logic block 1222. Upon receipt of such signal, function block 1224 facilitates notification of an operator in the event that $Q_{max}$ magnitude has increased by 30% to 100% over the time period being evaluated. Such notification is indicative of potential copper insulation delamination-based partial discharge activity and may be facilitated by methods that include, but are not limited to, initiating pop-up alarms on operator consoles, energizing audible control room alarms, and energizing annunciator windows.

Flow chart 1200 further includes a fourth delta $Q_{max}$ comparison functional logic block 1226 that is that is coupled in electronic data communication with logic block 1222 and is configured to receive the discrete "no" signal that is transmitted from logic block 1222. Logic block 1226 is also configured to make a determination whether the percentage change in $Q_{max}$ signal transmitted from function block 1206 includes a value greater than 100%. If the percentage change in $Q_{max}$ has more than doubled, a discrete "yes" signal is transmitted from logic block 1226. Otherwise, a discrete "no" signal is transmitted from logic block 1226.

Flow chart 1200 also includes a fourth notification function block 1228 that is coupled in electronic data communication with logic block 1226 and is configured to receive the discrete "yes" signal that is transmitted from logic block 1226. Upon receipt of such signal, function block 1228 facilitates notification of an operator in the event that $Q_{max}$ magnitude has at least doubled over the time period being evaluated. Such notification is indicative of a high risk of copper insulation delamination-based partial discharge activity and may be facilitated by methods that include, but are not limited to, initiating pop-up alarms on operator consoles, energizing audible control room alarms, and energizing annunciator windows. Flow chart 1200 further includes a discrete "end" functional logic block 1230 that is coupled in electronic data communication with logic block 1226. Logic block 1230 is configured to end evaluation of this $Q_{max}$ data upon receipt of the discrete "no" signal transmitted by logic block 1226.

Flow chart further includes a fifth delta $Q_{max}$ comparison functional logic block 1232 that is coupled in electronic data communication with logic block 1220 and is configured to receive the discrete "no" signal that is transmitted from logic block 1220. Logic block 1232 is also configured to make a determination whether the percentage change in $Q_{max}$ signal transmitted from function block 1206 includes a value between 30% and 100%. If the percentage change in $Q_{max}$ falls within this range, a discrete "yes" signal is transmitted from logic block 1232. Otherwise, a discrete "no" signal is transmitted from logic block 1232.

Flow chart 1200 also includes a fifth notification function block 1234 that is coupled in electronic data communication with logic block 1232 and is configured to receive the discrete "yes" signal is transmitted from logic block 1232. Upon receipt of such signal, function block 1234 facilitates notification of an operator in the event that $Q_{max}$ magnitude has increased by 30% to 100% over the time period being evaluated. Such notification is indicative of potential poor groundwall compactness-based partial discharge activity and may be facilitated by methods that include, but are not limited to, initiating pop-up alarms on operator consoles, energizing audible control room alarms, and energizing annunciator windows.

Flow chart 1200 further includes a sixth delta $Q_{max}$ comparison functional logic block 1236 that is that is coupled in electronic data communication with logic block 1232 and is configured to receive the discrete "no" signal that is transmitted from logic block 1232. Logic block 1236 is also configured to make a determination whether the percentage change in $Q_{max}$ signal transmitted from function block 1206 includes a value greater than 100%. If the percentage change in $Q_{max}$ has more than doubled, a discrete "yes" signal is transmitted from logic block 1236. Otherwise, a discrete "no" signal is transmitted from logic block 1236.

Flow chart 1200 also includes a sixth notification function block 1238 that is coupled in electronic data communication with logic block 1236 and is configured to receive the discrete "yes" signal that is transmitted from logic block 1236. Upon receipt of such signal, function block 1238 facilitates notification of an operator in the event that $Q_{max}$ magnitude has at least doubled over the time period being evaluated. Such notification is indicative of a high risk of poor groundwall compactness-based partial discharge activity and may be facilitated by methods that include, but are not limited to, initiating pop-up alarms on operator consoles, energizing audible control room alarms, and energizing annunciator windows. Flow chart 1200 further includes a discrete "end" functional logic block 1240 that is coupled in electronic data communication with logic block 1236. Logic block 1240 is configured to end evaluation of this $Q_{max}$ data upon receipt of the discrete "no" signal transmitted by logic block 1236.

Figure 16:
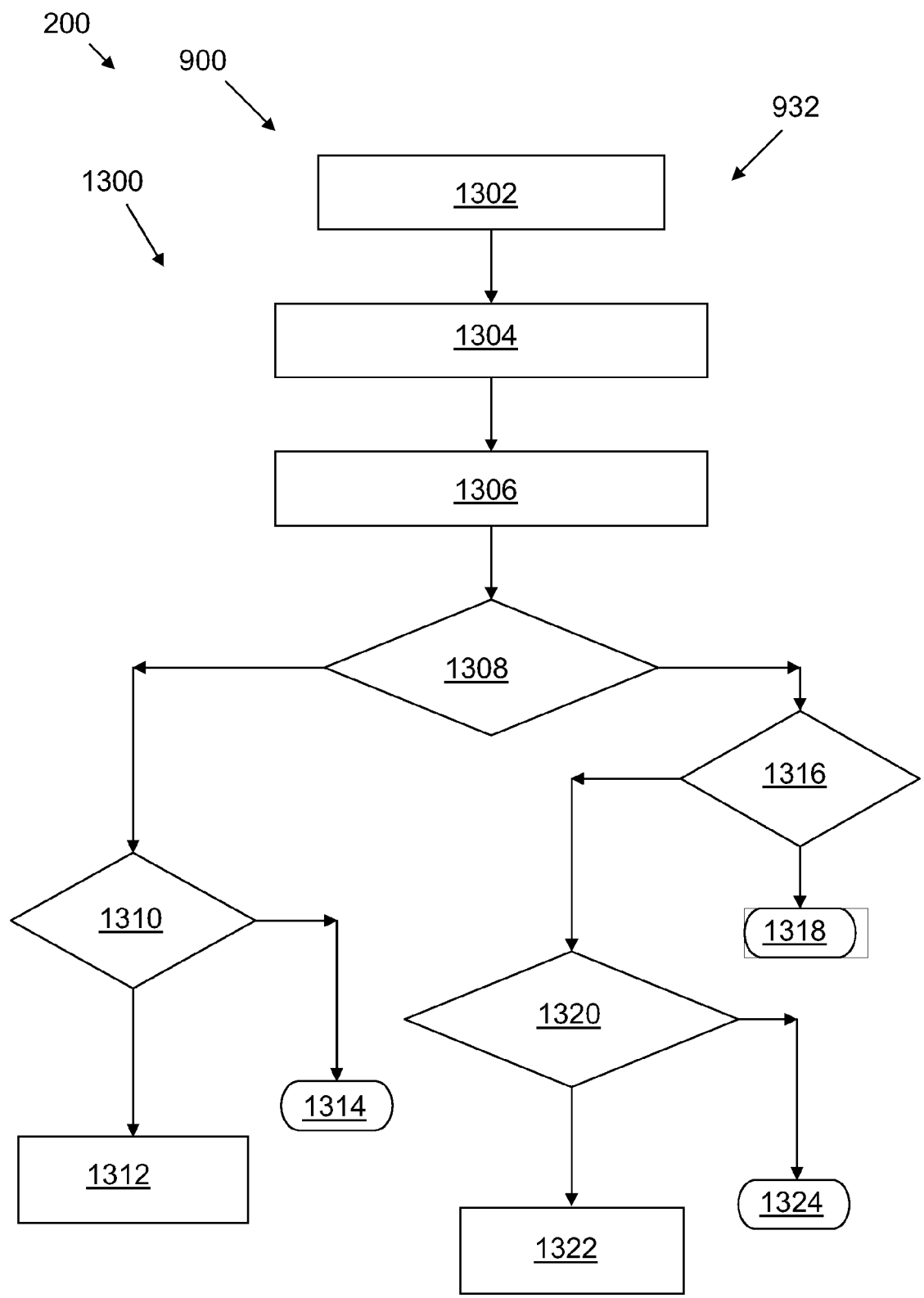
FIG. 16 is a flow chart illustrating determination features for partial discharge levels as a function of operational temperature data that may be used with the partial discharge analyzer system shown in FIG. 1.

FIG. 16 is a flow chart 1300 illustrating determination features for partial discharge levels as a function of operational temperature data that may be used with partial discharge analyzer system 100 (shown in FIG. 1). Flow chart 1300 includes at least a portion of the database 1302 electronically maintained within logger module 108 (shown in FIG. 1). Flow chart 1300 also includes a data selection and trending function block 1304 that is coupled in electronic data communication with database portion 1302. Function block 1304 is configured to select, receive and transmit data from database portion 1302 that includes, but is not limited to, temperature time-stamped data in units of ° C. (° F.) collected from machine 118 based on a predetermined time period and time-stamped $Q_{max}$ data. Such $Q_{max}$ data may include classification and type data that is determined and evaluated as described above. In the exemplary embodiment, the $Q_{max}$ data is pulled from the database as a function of its W-T classification. Alternatively, any $Q_{max}$ data that facilitates operation of system 100 as described herein is pulled from the database.

Flow chart 1300 further includes a percentage change in $Q_{max}$ function block 1306 that is coupled in electronic data communication with function block 1304. Function block 1306 is configured to receive $Q_{max}$ data and temperature data transmitted from function block 1304. Function block 1306 is also configured to determine at least two instances wherein measurements of temperature transients associated with machine 118 that exceeds 50° C. within machine 118. Moreover, function block 1306 is configured to receive load and hydrogen pressure data from database portion 1302 wherein function block 1306 evaluates if a predetermined set of measured parameters that are known to affect partial discharge activity are substantially static during the time period evaluated.

Specifically, in the exemplary embodiment, function block 1306 makes a determination if the measured load data is substantially constant within a +/−5% range of a first load measurement. Also, specifically, in the exemplary embodiment, function block 1306 makes a determination if the measured hydrogen pressure remains substantially constant within a +/−10% range of a first hydrogen pressure measurement. Alternatively, any process measurements known to affect partial discharge activity are determined to be substantially static or permitted to vary in a limited, predetermined range, are used. If the substantially static conditions are satisfied, a percentage change in $Q_{max}$ for substantially the same time period associated with the temperature data is calculated and a signal representative of such percentage change is transmitted from function block 1306.

Flow chart 1300 also includes a positive predominance functional logic block 1308 that is coupled in electronic data communication with function block 1306 and is configured to receive the $Q_{max}$ percentage change signal that is transmitted from function block 1306. If the $Q_{max}$ data being evaluated via flow chart 1300 exhibits tendencies of positive predominance a discrete "yes" signal is transmitted from logic block 1308. Otherwise, a discrete "no" signal is transmitted from logic block 1308.

Flow chart 1300 further includes a first delta $Q_{max}$ comparison functional logic block 1310 that is coupled in electronic data communication with logic block 1308 and is configured to receive the discrete "yes" signal that is transmitted from logic block 1308. Logic block 1310 is also configured to make a determination whether the percentage change in $Q_{max}$ signal transmitted from function block 1306 includes a value greater than 30%. If the percentage change in $Q_{max}$ exceeds 30%, a discrete "yes" signal is transmitted from logic block 1310. Otherwise, a discrete "no" signal is transmitted from logic block 1310.

Flow chart 1300 also includes a first notification function block 1312 that is coupled in electronic data communication with logic block 1310 and is configured to receive the discrete "yes" signal that is transmitted from logic block 1310. Upon receipt of such signal, function block 1312 facilitates notification of an operator in the event that $Q_{max}$ magnitude has increased by at least 30% over the time period being evaluated. Such notification is indicative of a potential of partial discharge activity due to degradation of silicon carbide grading and may be facilitated by methods that include, but are not limited to, initiating pop-up alarms on operator consoles, energizing audible control room alarms, and energizing annunciator windows. Flow chart 1300 further includes a discrete "end" functional logic block 1314 that is coupled in electronic data communication with logic block 1310. Logic block 1314 is configured to end evaluation of this $Q_{max}$ data upon receipt of the discrete "no" signal transmitted by logic block 1310.

Flow chart 1300 also includes a negative predominance functional logic block 1316 that is coupled in electronic data communication with logic block 1308 and is configured to receive the discrete "no" signal that is transmitted from logic block 1308. If the $Q_{max}$ data being evaluated via flow chart 1300 exhibits tendencies of negative predominance a discrete "yes" signal is transmitted from logic block 1316. Otherwise, a discrete "no" signal is transmitted from logic block 1316. Flow chart 1300 further includes a discrete "end" functional logic block 1318 that is coupled in electronic data communication with logic block 1316. Logic block 1318 is configured to end evaluation of this $Q_{max}$ data upon receipt of the discrete "no" signal transmitted by logic block 1316.

Flow chart 1300 further includes a second delta $Q_{max}$ comparison functional logic block 1320 that is coupled in electronic data communication with logic block 1316 and is configured to receive the discrete "yes" signal that is transmitted from function block 1316. Logic block 1320 is also configured to make a determination whether the percentage change in $Q_{max}$ signal transmitted from function block 1306 includes a value greater than 30%. If the percentage change in $Q_{max}$ exceeds 30%, a discrete "yes" signal is transmitted from logic block 1320. Otherwise, a discrete "no" signal is transmitted from logic block 1320.

Flow chart 1300 also includes a second notification function block 1322 that is coupled in electronic data communication with logic block 1320 and is configured to receive the discrete "yes" signal that is transmitted from logic block 1320. Upon receipt of such signal, function block 1322 facilitates notification of an operator in the event that $Q_{max}$ magnitude has increased by at least 30% over the time period being evaluated. Such notification is indicative of a potential of partial discharge activity due to groundwall delamination and may be facilitated by methods that include, but are not limited to, initiating pop-up alarms on operator consoles, energizing audible control room alarms, and energizing annunciator windows. Flow chart 1300 further includes a discrete "end" functional logic block 1324 that is coupled in electronic data communication with logic block 1320. Logic block 1324 is configured to end evaluation of this $Q_{max}$ data upon receipt of the discrete "no" signal transmitted by logic block 1320.

Figure 17:
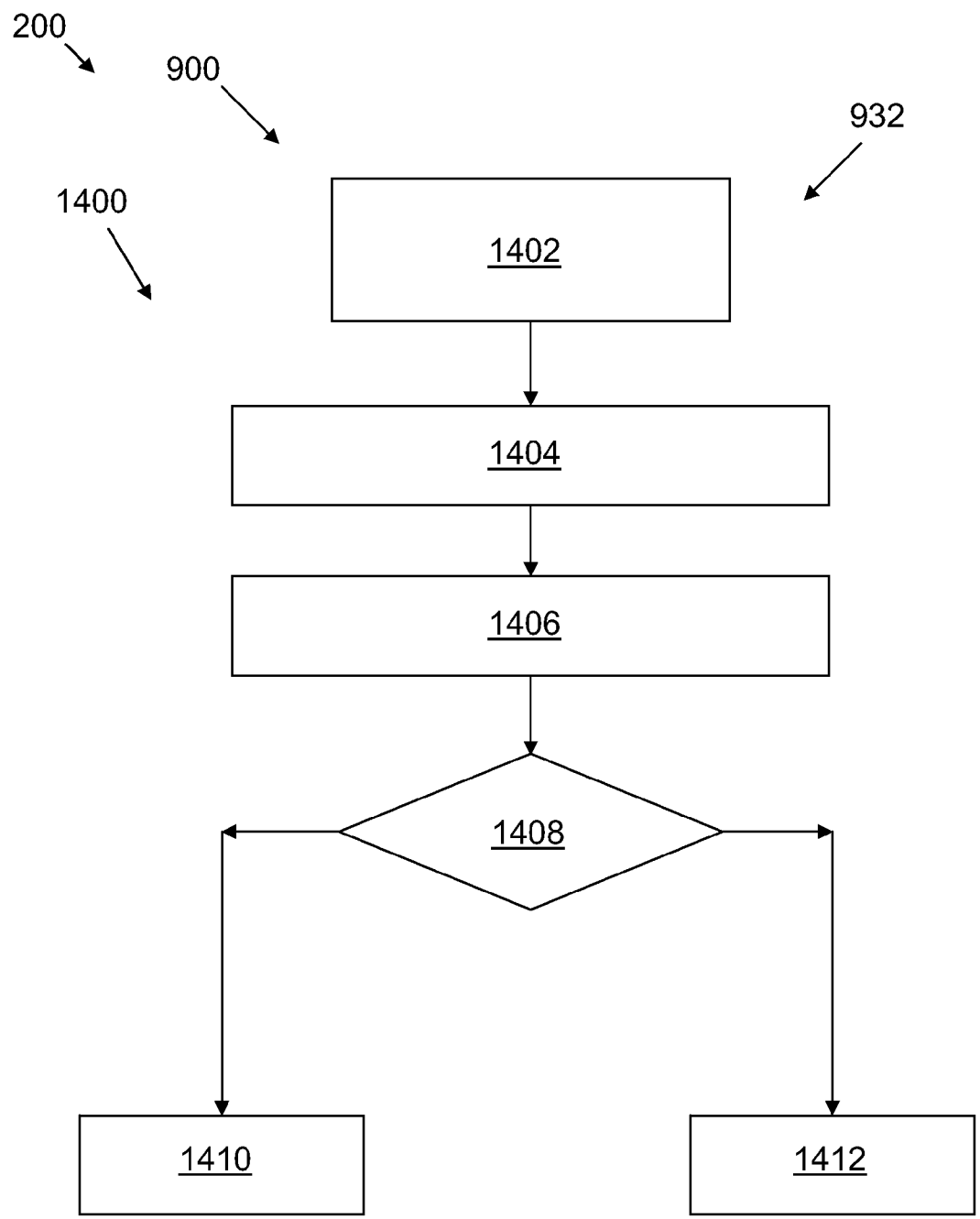
FIG. 17 is a flow chart illustrating determination features for partial discharge levels as a function of operational hydrogen pressure data that may be used with the partial discharge analyzer system shown in FIG. 1.

FIG. 17 is a flow chart 1400 illustrating determination features for partial discharge levels as a function of operational hydrogen pressure data that may be used with partial discharge analyzer system 100 (shown in FIG. 1). Flow chart 1400 includes at least a portion of the database 1402 electronically maintained within logger module 108 (shown in FIG. 1). Flow chart 1400 also includes a data selection and trending function block 1404 that is coupled in electronic data communication with database portion 1402. Function block 1404 is configured to select, receive and transmit data from database portion 1402 that includes, but is not limited to, hydrogen pressure time-stamped data in units of kilopascal (kPa) (pounds per square inch (psi)) collected from machine 118 based on a predetermined time period and time-stamped $Q_{max}$ data. Such $Q_{max}$ data may include classification and type data that is determined and evaluated as described above. In the exemplary embodiment, the $Q_{max}$ data is pulled from the database as a function of its W-T classification. Alternatively, any $Q_{max}$ data that facilitates operation of system 100 as described herein is pulled from the database.

Flow chart 1400 further includes a change in $Q_{max}$ to change in hydrogen pressure ratio function block 1406 that is coupled in electronic data communication with function block 1404. Function block 1406 is configured to receive $Q_{max}$ data and hydrogen pressure data transmitted from function block 1404. Moreover, function block 1306 is configured to receive load and temperature data from database portion 1304 wherein function block 1306 evaluates if a predetermined set of measured parameters that are known to affect partial discharge activity are substantially static during the time period evaluated.

Specifically, in the exemplary embodiment, function block 1406 makes a determination if the measured load data is substantially constant within a +/−5% range of a first load measurement. Specifically, in the exemplary embodiment, function block 1406 makes a determination if the measured temperature data is substantially constant at 50° C. (122° F.) within a range of +/−5° C. (9° F.). Also, specifically, in the exemplary embodiment, function block 1406 makes a determination if the $Q_{max}$ data is predominately positive and/or negative. Alternatively, any process measurements known to affect partial discharge activity are determined to be substantially static or permitted to vary in a limited, predetermined range, are used. If the substantially static conditions are satisfied, function block 1406 is configured to calculate a value for a ratio of the change of $Q_{max}$ data as compared to the change in hydrogen pressure within machine 118 for substantially the same time period associated with the hydrogen pressure data and a signal representative of such ratio is transmitted from function block 1406.

Flow chart 1400 further includes a comparative ratio functional logic block 1408 that is coupled in electronic data communication with function block 1406. Logic block 1408 is configured to receive the ratio signal transmitted by function block 1406 and to compare the ratio to zero. If the partial discharge activity decreases as hydrogen pressure increases, the ratio is less than zero which is an indication that the PD activity is internal to machine 118. If the partial discharge activity increases as hydrogen pressure increases, the ratio is greater than zero which is an indication that the PD activity is external to machine 118.

Accordingly, logic block 1408 is configured to transmit a discrete "yes" signal if the ratio is less than zero and a discrete "no" signal if the ratio is greater than zero. Flow chart 1400 also includes a first notification function block 1410 that is coupled in electronic data communication with logic block 1408 and is configured to receive the discrete "yes" signal transmitted from logic block 1408. Function block 1410 is also configured to notify an operator that the PD data being evaluated originated from a source within machine 118.

Similarly, flow chart 1400 also includes a second notification function block 1412 that is coupled in electronic data communication with logic block 1408 and is configured to receive the discrete "no" signal transmitted from logic block 1408. Function block 1412 is also configured to notify an operator that the PD data being evaluated originated from a source external to machine 118.

Figure 18:
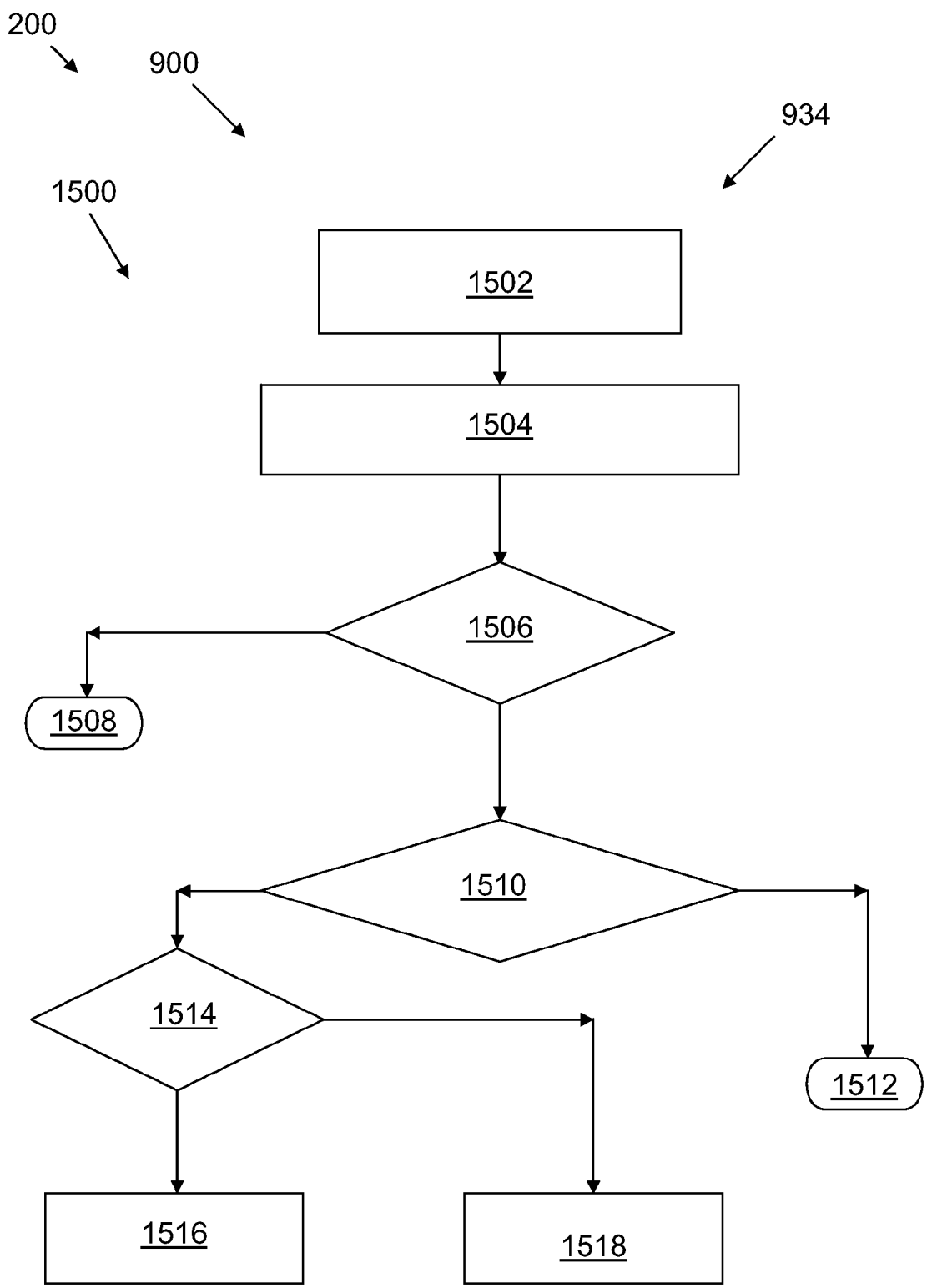
FIG. 18 is a flow chart illustrating machine partial discharge protective relay and alarm features that may be used with the partial discharge analyzer system shown in FIG. 1.

Method portion 900 also includes a method step 934 determine protective scheme features for your electrical machine. FIG. 18 is a flow chart 1500 illustrating machine partial discharge protective relay and alarm features that may be used with partial discharge analyzer system 100 (shown in FIG. 1). Flow chart 1500 includes at least a portion of the database 1502 electronically maintained within logger module 108 (shown in FIG. 1). Flow chart 1500 also includes a data selection and trending function block 1504 that is coupled in electronic data communication with database portion 1502. Function block 1504 is configured to select, receive and transmit data from database portion 1502 that includes, but is not limited to, time-stamped $Q_{max}$ data and time-stamped historical protective relay data is collected from machine 118 based on a predetermined time period. Such $Q_{max}$ data may include classification and type data that is determined and evaluated as described above. In the exemplary embodiment, the $Q_{max}$ data is pulled from the database as a function of its W-T classification. Alternatively, any $Q_{max}$ data that facilitates operation of system 100 as described herein is pulled from the database. Also, in the exemplary embodiment, the protective relay data is associated with the discrete energizing and de-energizing events of a synchronization relay (not shown) as well as an analog synchronization angle signal recorded during electrical synchronization activities of machine 118 to an electric grid (not shown). Alternatively, any historical operational discrete or analog data associated with a protective scheme of machine 118 is used.

Flow chart 1500 also includes a synchronization angle functional logic block 1506 that is coupled in electronic data communication with function block 1504 and is configured to receive the synchronization angle data and $Q_{max}$ data transmitted from function block 1504. Logic block 1506 is also configured to compare such synchronization angle data with a predetermined value. In the exemplary embodiment, such value is 5°. Alternatively, any value for synchronization phase angle is used. Logic block is further configured to transmit a discrete "yes" signal if the phase angle data is less than 5° or a discrete "no" signal if the phase angle is not less than 5°. Flow chart 1500 further includes a discrete "end" functional logic block 1508 that is coupled in electronic data communication with logic block 1506. Logic block 1508 is configured to end evaluation of this $Q_{max}$ data upon receipt of the discrete "no" signal transmitted by logic block 1506.

Flow chart 1500 further includes a delta $Q_{max}$ comparison functional logic block 1510 that is coupled in electronic data communication with logic block 1506 and is configured to receive the discrete "yes" signal that is transmitted from function block 1506. Logic block 1510 is also configured to make a determination whether the percentage change in $Q_{max}$ signal transmitted from function block 1506 includes a value greater than 30%. If the percentage change in $Q_{max}$ exceeds 30%, a discrete "yes" signal is transmitted from logic block 1510. Otherwise, a discrete "no" signal is transmitted from logic block 1510. Flow chart 1500 also includes a discrete "end" functional logic block 1512 that is coupled in electronic data communication with logic block 15010 Logic block 1512 is configured to end evaluation of this $Q_{max}$ data upon receipt of the discrete "no" signal transmitted by logic block 1510.

Flow chart 1500 further includes an end winding partial discharge functional logic block 1514 that is coupled in electronic data communication with logic block 1510 and is configured to receive the discrete "yes" signal from logic block 1510. Logic block 1514 is further configured to determine if the change in $Q_{max}$ data is within a range typically associated with end winding partial discharge activity. Accordingly, logic block 1514 is configured to transmit a discrete "yes" signal if the end winding PD activity is indicated and a discrete "no" signal if end winding PD activity is not indicated. Flow chart 1500 also includes a first notification function block 1516 that is coupled in electronic data communication with logic block 1514 and is configured to receive the discrete "yes" signal transmitted from logic block 1514. Function block 1516 is also configured to notify an operator that the PD data being evaluated indicates potential PD damage in the end windings or an associated support system within machine 118.

Similarly, flow chart 1500 also includes a second notification function block 1518 that is coupled in electronic data communication with logic block 1514 and is configured to receive the discrete "no" signal transmitted from logic block 1514. Function block 1518 is also configured to notify an operator that the PD data being evaluated indicates potential PD damage in stator bars at gradings or at slot exit regions within machine 118.

The above-described method and apparatus for analyzing electrical insulation of an electrical machine are cost-effective and highly reliable. The analyzer system receives process parameter information from plant sensors through a data acquisition system and partial discharge information that includes both partial discharge pluses and noise. The analyzer system separates the noise pulses from the partial discharge pulses and classifies the partial discharge pulses using the characteristics of each pulse. Similar pulse classes are evaluated using rules and/or a pulse model to determine a location and character of the partial discharge events. Data from a history of the electrical machine and/or other similar machines in a fleet of machines is used to facilitate the determination. The received process parameter information and partial discharge information are stored in a database for later analysis and/or processing. Such analysis and/or processing results are executed automatically and are generated substantially close to a present time, or in real-time.

While the invention has been described in terms of various specific embodiments, those skilled in the art will recognize that the invention can be practiced with modification within the spirit and scope of the claims.

What is claimed is:

1. A method of analyzing partial discharge data collected from an electrical device comprising:
   collecting partial discharge data from a first electrical device belonging to a group of electrical devices, wherein the group of electrical devices is at least partially defined by at least one electrical device classification;
   using a processor for configuring a partial discharge analyzer system with at least one percentile transfer function for use in determining at least one maximum partial discharge charge ($Q_{max}$) value;
   generating a comparison of at least a portion of the partial discharge data collected from the first electrical device with at least a portion of the partial discharge data collected from at least one second electrical device selected from the group of electrical devices that includes the first electrical device; and
   transmitting the results.

2. A method in accordance with claim 1 wherein generating a comparison of at least a portion of the partial discharge data comprises:
   generating a database of partial discharge pulse data collected from the at least one second electrical device; and
   sorting at least a portion of the partial discharge data collected from the at least one second electrical device into at least one data group that is at least partially defined by the at least one electrical device classification.

3. A method in accordance with claim 1 wherein collecting partial discharge data from a first electrical device comprises defining the group of electrical devices based on a voltage rating of the electrical devices.

4. A method in accordance with claim 1 wherein configuring the partial discharge analyzer system with at least one percentile transfer function comprises programming a plurality of algorithms to determine a plurality of values associated with the at least one $Q_{max}$ value.

5. A method in accordance with claim 4 wherein programming a plurality of algorithms comprises configuring each of the at least one percentile transfer function to use at least one hydrogen pressure measurement value to determine at least one of:
   at least one average $Q_{max}$ value ($Q_{max\ Ave}$) at least one maximum $Q_{max}$ value ($Q_{max\ Max}$);
   at least one $25^{th}$ percentile $Q_{max}$ value ($Q_{max\ 25\%}$);
   at least one $50^{th}$ percentile $Q_{max}$ value ($Q_{max\ 50\%}$)
   at least one $75^{th}$ percentile $Q_{max}$ value ($Q_{max\ 75\%}$);
   at least one $90^{th}$ percentile $Q_{max}$ value ($Q_{max\ 90\%}$); and
   at least one $95^{th}$ percentile $Q_{max}$ value ($Q_{max\ 95\%}$).

6. A method in accordance with claim 5 wherein programming a plurality of algorithms further comprises programming a set of algorithms for at least one of $Q_{max\ Ave}$, $Q_{max\ Max}$, $Q_{max\ 25\%}$, $Q_{max\ 50\%}$, $Q_{max\ 75\%}$, $Q_{max\ 90\%}$, and $Q_{max\ 95\%}$ as a function of the at least one electrical device classification.

7. A method in accordance with claim 1 wherein generating a comparison of at least a portion of the partial discharge data comprises at least one of:
   determining partial discharge sources internal to the first electrical device;
   ranking the first electrical device with respect to the at least one second electrical device;
   creating baseline data for the first electrical device;
   determining a trending pattern for the first electrical device;
   determining a plurality of operator notification criteria; and
   determining at least one electrical protective scheme for the first electrical device.

8. A method in accordance with claim 7 wherein generating a comparison of at least a portion of the partial discharge data further comprises analyzing and comparing a plurality of partial discharge characteristics determined from at least a portion of the partial discharge data collected from the first electrical device as a function of at least one of:
   at least one first electrical device voltage measurement;
   at least one first electrical device real electric power measurement;
   at least one first electrical device reactive electric power measurement;
   at least one first electrical device hydrogen pressure measurement; and
   at least one first electrical device temperature measurement.

9. A partial discharge analyzer system comprising:
   at least one output device; and
   a processor coupled in electronic data communication with said at least one output device, wherein said processor is programmed with a plurality of percentile transfer function algorithms configured to determine at least one maximum partial discharge charge ($Q_{max}$) value and to generate a comparison of at least a portion of partial discharge data collected from a first electrical device with at least a portion of partial discharge data collected from at least one second electrical device, wherein said processor is further programmed to generate and transmit the comparison to said at least one output device, wherein the comparison is at least partially generated as a function of at least one of:

at least one electrical device classification; and at least one electrical device operational parameter.

10. A partial discharge analyzer system in accordance with claim 9 wherein the plurality of percentile transfer functions are at least partially defined by at least one electrical device classification that is a voltage rating.

11. A partial discharge analyzer system in accordance with claim 9 wherein the plurality of percentile transfer functions are at least partially defined by at least one electrical device operational parameter that is a hydrogen pressure measurement.

12. A partial discharge analyzer system in accordance with claim 9 wherein the plurality of percentile transfer functions are configured to facilitate at least one of:

comparison of the magnitude of at least one characteristic of each of the plurality of partial discharge pulses within the first electrical device; and determination of a magnitude of at least one characteristic of each of a plurality of partial discharge pulses relating to a location and character of partial discharges in the first electrical device.

13. A partial discharge analyzer system in accordance with claim 9 wherein the comparison includes at least one of:

a determination of partial discharge sources internal to the first electrical device; and a ranking of the first electrical device with respect to the at least one second electrical device.

14. A partial discharge analyzer system in accordance with claim 13 wherein the comparison further includes at least one of:

baseline data for the first electrical device;

a trending pattern for the first electrical device;

at least one operator notification; and a determination of at least one electrical protective scheme for the first electrical device.

15. A partial discharge analyzer system in accordance with claim 13 wherein the comparison further includes a plurality of partial discharge characteristics determined from at least a portion of the partial discharge data collected from the first electrical device as a function of at least one of:

at least one first electrical device voltage measurement;

at least one first electrical device real electric power measurement;

at least one first electrical device reactive electric power measurement;

at least one first electrical device hydrogen pressure measurement; and at least one first electrical device temperature measurement.

16. An electrical device monitoring system comprising:

a data acquisition system adapted to transmit a first signal substantially representative of a measurement received from at least one process parameter sensor; and a partial discharge analyzer system configured to receive the first signal and a second signal substantially representative of high frequency electromagnetic pulses comprising a processor programmed with a plurality of percentile transfer function algorithms configured to determine at least one maximum partial discharge charge ($Q_{max}$) value and to generate a comparison of at least a portion of partial discharge data collected from a first electrical device with at least a portion of partial discharge data collected from at least one second electrical device, wherein said processor is further programmed to generate and transmit the comparison, wherein the comparison is at least partially generated as a function of at least one of:

at least one electrical device classification; and at least one electrical device operational parameter.

17. An electrical device monitoring system in accordance with claim 16 wherein the plurality of percentile transfer functions are at least partially defined by at least one electrical device classification that is a voltage rating.

18. An electrical device monitoring system in accordance with claim 16 wherein the plurality of percentile transfer functions are at least partially defined by at least one electrical device operational parameter that is a hydrogen pressure measurement.

19. An electrical device monitoring system in accordance with claim 16 wherein the plurality of percentile transfer functions are configured to facilitate at least one of:

comparison of the magnitude of at least one characteristic of each of the plurality of partial discharge pulses within the electrical device; and determination of a magnitude of at least one characteristic of each of a plurality of partial discharge pulses relating to a location and character of partial discharges in the electrical device.

* * * * *